United States Patent [19]
Tomita et al.

[11] Patent Number: 5,763,829
[45] Date of Patent: Jun. 9, 1998

[54] LEADFRAME INCLUDING FRAME-CUTTING SLIT FOR LEAD-ON-CHIP (LOC) SEMICONDUCTOR DEVICE AND SEMICONDUCTOR DEVICE INCORPORATING THE LEADFRAME

[75] Inventors: Yoshihiro Tomita; Naoto Ueda; Yoshirou Nishinaka; Shunichi Abe; Hideyuki Ichiyama, all of Itami, Japan

[73] Assignee: Mitsubishi Denki Kabushiki Kaisha, Tokyo, Japan

[21] Appl. No.: 506,852

[22] Filed: Jul. 25, 1995

Related U.S. Application Data

[62] Division of Ser. No. 325,637, Oct. 19, 1994, Pat. No. 5,535,509, which is a division of Ser. No. 70,990, Jun. 4, 1993, abandoned.

[30] Foreign Application Priority Data

Jun. 5, 1992 [JP] Japan .................. 4-145697

[51] Int. Cl.⁶ .................. H01L 23/02
[52] U.S. Cl. .................. 174/52.2; 174/52.4; 257/676; 257/666; 257/787
[58] Field of Search .................. 174/52.4; 361/813, 361/723, 820; 257/672, 674, 676, 666, 667, 668, 669, 670, 787

[56] References Cited

U.S. PATENT DOCUMENTS

| | | | |
|---|---|---|---|
| 3,590,328 | 6/1971 | Frescura | 317/101 |
| 4,480,150 | 10/1984 | Jones et al. | 174/52 |
| 4,680,613 | 7/1987 | Daniels et al. | 257/666 |
| 4,714,952 | 12/1987 | Takekawa et al. | 357/75 |
| 4,764,804 | 8/1988 | Sahara | 357/81 |
| 4,791,473 | 12/1988 | Phy | 357/70 |
| 4,897,508 | 1/1990 | Mahulikar | 174/52.4 |
| 5,089,439 | 2/1992 | Lippey | 437/209 |
| 5,188,982 | 2/1993 | Huang | 437/209 |
| 5,218,229 | 6/1993 | Farnworth | 257/676 |
| 5,287,000 | 2/1994 | Takahashi et al. | 257/676 |
| 5,293,066 | 3/1994 | Tsumura | 257/668 |
| 5,334,803 | 8/1994 | Yamamura et al. | 174/52.4 |
| 5,338,971 | 8/1994 | Casati et al. | 257/666 |
| 5,475,918 | 12/1995 | Kubota et al. | 29/827 |

FOREIGN PATENT DOCUMENTS

| | | |
|---|---|---|
| 0108502 | 5/1984 | European Pat. Off. . |
| 0272187 | 6/1988 | European Pat. Off. . |
| 0354696 | 2/1990 | European Pat. Off. . |
| 54-21168 | 2/1979 | Japan . |
| 63-306647 | 6/1987 | Japan . |
| 169041 | 9/1987 | Japan . |
| 1187841 | 1/1988 | Japan . |
| 63-34966 | 2/1988 | Japan . |
| 1289258 | 5/1988 | Japan . |
| 245967 | 8/1988 | Japan . |
| 2137253 | 11/1988 | Japan . |
| 2143449 | 11/1988 | Japan . |
| 2158159 | 12/1988 | Japan . |
| 2213156 | 2/1989 | Japan . |
| 62234947 | 3/1989 | Japan . |
| 33354 | 5/1989 | Japan . |
| 344596 | 7/1989 | Japan . |
| 3167834 | 11/1989 | Japan . |
| 3235360 | 2/1990 | Japan . |
| 443670 | 6/1990 | Japan . |
| 449649 | 6/1990 | Japan . |
| 412561 | 5/1991 | Japan . |

OTHER PUBLICATIONS

Shukla et al., "A Critical Review of VLSI Die-Attachment In High Reliability Applications", Solid State Technology, Jul. 1985, pp. 67–74.

Hans-Jürgen Hacke, "Montage Integrierter Schaltungen", Springer-Verlag Berlin, Heidelberg New York, 1987, pp. 30–42.

Primary Examiner—Kristine L. Kincaid
Assistant Examiner—Hung V. Ngo
Attorney, Agent, or Firm—Leydig, Voit & Mayer, Ltd.

[57] ABSTRACT

A high-reliability semiconductor device and a method of producing the device. Absorption of moisture into a semiconductor device is effectively avoided by using a hard solder material, such as common solder having no moisture absorption, for die-bonding a semiconductor chip to a die pad. Thus, in the semiconductor device in accordance with the present inventions there are no corrosion problems nor package-cracking due to absorbed moisture.

2 Claims, 25 Drawing Sheets

LEADFRAME INCLUDING FRAME-CUTTING SLIT FOR LEAD-ON-CHIP (LOC) SEMICONDUCTOR DEVICE AND SEMICONDUCTOR DEVICE INCORPORATING THE LEADFRAME

This disclosure is a division of patent application Ser. No. 08/325,637, filed Oct. 19, 1994 U.S. Pat. No. 5,535,509, which is a divisional patent application of prior patent application Ser. No. 08/070,990, filed Jun. 4, 1993, now abandoned.

BACKGROUND OF THE INVENTION

1. Field of the Invention

The present invention relates to a semiconductor device having a lead-on-chip structure with leads extending over a surface of a semiconductor chip, and relates to a method for producing it. The present invention also relates to a leadframe for use in such a device or in production of such a device.

2. Description of the Related Art

FIG. 35 is a cross sectional view of a conventional semiconductor device having a lead-on-chip structure (hereafter referred to as LOC-structure). Such a device is disclosed, for example, in Japanese Patent Application Laid-Open No.2-45969. As shown in FIG. 35, the device comprises a die pad 1, a semiconductor chip 2, and a plurality of leads 3 extending toward the semiconductor chip from its both sides, each of the plurality of leads 3 comprising an inner lead portion 3a and an outer lead portion 3b. The device further comprises thin metal wires 5, molding resin 6, and a plurality of electrodes 4 along both sides of a primary surface of the semiconductor chip 2.

An integrated circuit (not shown) and electrodes 4 are formed by photolithography or the like on the upper primary surface of the semiconductor chip 2. The semiconductor chip 2 is fixed on the die pad 1 by bonding the back primary surface of the semiconductor chip 2 to the die pad 1 with a conductive adhesive such as a conductive resin. The inner lead portions 3a are each electrically connected to the electrodes 4 on the semiconductor chip 2 via the thin metal wires 5. These elements described above are sealed with molding resin 6 except for the outer lead portions 3b so that each outer lead portion 3b of leads 3 is exposed to the outside. The outer lead portions 3b of the leads 3 are each formed into a desired shape such as a straight type, gull wing type, J-type, etc.

Japanese Patent Application Laid-Open No.2-45969 also discloses a method for producing such a device described above. In accordance with this method, two frames are used: a first frame comprising an outer frame and a die pad disposed inside the outer frame, the die pad being connected to the outer frame via a suspending lead; and a second frame comprising an outer frame and a plurality of leads extending inward from the outer frame. The die pad of the first frame is sunk (depressed) downward by an amount larger than the thickness of the semiconductor chip. After a semiconductor chip is die-bonded on the die pad of the first frame, the second frame is connected to the first frame so that each lead extends over the semiconductor chip with a predetermined constant spacing between each lead and the upper surface of the chip. Then, wire-bonding and resin-molding are performed. The unnecessary portions of frames such as outer frames are removed to obtain a separate semiconductor device. Finally, for each outer lead portion of the leads is bent, thus a completed semiconductor device is obtained.

In a conventional semiconductor device with the LOC-structure described above, a semiconductor chip is die-bonded onto a die pad with a conductive resin or the like. However, resin materials exhibit moisture absorption, thus moisture absorbed in resin may cause degradation in the adhesive strength, and/or may corrode the semiconductor chip or leads in contact with the resin. To mount a semiconductor device on a circuit board or the like, the semiconductor device is put on the circuit board, then the circuit board with the chip are placed in a hot environment to heat it. Thus, the outer lead portions are soldered to the circuit board. The moisture absorbed in the die-bonding resin confined in the molding resin is evaporated during the soldering process, which may result in separation of the semiconductor chip from the die pad, and/or result in cracks in a package.

In the conventional production method using two frames described above, the outer parts of two frames remain connected to reach other until the molding process is completed. As a result, these outer frames act as obstacles, and difficulty occurs in handling. Therefore, during the succeeding processes after the two frames are connected, failures often occur in transferring frames, and/or liquid used for processing penetrates between the outer frames, leaking later to cause contamination. In particular, in the case of a production process including a step for plating the outer lead portions of the semiconductor device before separating the semiconductor device from the frames, serious problems occur because plating solution can penetrate between two outer frames and may leak some time later.

In another method known in the art, a single frame is used to produce a semiconductor device having LOC-structure, the single frame comprising a die pad and leads formed in an integral fashion. In such a type of leadframe, a die pad is disposed between the leads extending from both sides of the leadframe, and the die pad extends in the directions perpendicular to these leads. However, the width of the die pad cannot be enlarged exceed the lead area. As a result, only narrow die pads are available. Japanese Patent Application Laid-Open No.64-69041 discloses a leadframe having a die pad with a large width extending beyond the area of the leads. In this case, however, the length of leads, in turn, should be shortened, or otherwise, the leads may be deformed. As a result, longer thin metal wires are required for wire-bonding and/or the choice of locations of the electrodes on the semiconductor chip is limited.

In the case where a semiconductor device is produced using a leadframe having a die pad as well as leads formed in an integral fashion, the die pad is sunk by the amount corresponding to the thickness of a semiconductor chip, and the semiconductor chip is inserted between the leads and the die pad, then the semiconductor chip is die-bonded on the die pad. However, in the case where the die pad extends perpendicular to the direction in which the leadframe is transferred during the production processes of the semiconductor device, the semiconductor chip must be inserted between the leads and the sunk die pad in the same direction as that of the leadframe-transfer path. This insertion process is difficult to perform, and complicated and troublesome operations are required. Furthermore, it also requires complicated and troublesome operations to die-bond a semiconductor chip onto the die pad with hard solder after the semiconductor chip is inserted. There are such problems in conventional semiconductor devices and methods for producing them.

SUMMARY OF THE INVENTION

It is an object of the present invention to solve the problems described above. More specifically, it is an object of the present invention to provide a higher-reliability semiconductor device having a LOC-structure in which no corrosion occurs. It is another object of the present invention to provide a method for producing such a semiconductor device without a liquid-leakage problem during production processes. It is a further object of the present invention to provide a leadframe for use in such a semiconductor device.

To achieve the above objects, in accordance with a first aspect of the present invention, a semiconductor device having a LOC-structure is provided wherein a semiconductor chip is die-bonded onto a die pad with a hard solder material exhibiting no moisture absorption.

In accordance with a second aspect of the present invention, a method is provided for producing such a semiconductor device using two frames, that is, a frame for the leads and a frame for the die pad, wherein immediately after these two frames are connected to each other, an outer frame portion of the frame for the die pad is cut off and removed via frame-cutting slits formed in the frame for leads.

A third aspect of the present invention provides a leadframe comprising two frames including a frame for leads, having frame-cutting slits, for use in production of a semiconductor device in accordance with the second aspect of the invention.

Furthermore, a fourth aspect of the present invention provides a leadframe for use in production of a semiconductor device comprising a die pad and leads formed in an integral fashion, the die pad including a main pad disposed between two sets of leads, one of the sets of leads being formed on one side of an outer frame of the leadframe, and the other set of leads being formed on the other side of the outer frame of the leadframe, the main pad extending perpendicular to these leads the leads extending inward from both sides of the outer frame of the leadframe, the die pad further including at least one branch pad extending approximately perpendicular to the main pad and extending between two neighboring leads extending from the above outer frame.

A fifth aspect of the present invention provides a method for producing a semiconductor device by using a leadframe in accordance with the fourth aspect of the present invention. In this method, the width of a die pad is widened so as to ensure that a semiconductor chip can be located on the die pad in a more stable manner. Another feature of this method is that when a semiconductor chip is heated via a die pad so as to make wire-bonding easier, the efficiency of heat conduction can be improved.

A sixth aspect of the present invention provides a leadframe including a die pad extending inward from an outer frame of the leadframe, the leadframe further including leads extending toward the die pad from both sides of the outer frame of the leadframe, the die pad and the leads being formed in an integral fashion. In this leadframe, the die pad is connected to the portions of the outer frame on both sides, wherein both the portions are bent in the same direction perpendicular to the leadframe plane so as to form U-shaped portions, so that the die pad is sunk from the outer frame and also from the leads. The U-shaped portions have a size large enough to insert a semiconductor chip through one of these U-shaped portions.

A seventh aspect of the present invention provides a method for producing a semiconductor device by using a leadframe in accordance with the sixth aspect of the present invention, the leadframe including a die pad extending in a direction perpendicular to the leadframe-transfer direction, the leadframe further including leads extending toward the die pad from both sides of the outer frame of the leadframe, the die pad and the leads being formed in an integral fashion. In this method, portions of both sides of the outer frame at which the die pad is connected to the outer frame are bent in the same direction perpendicular to the frame plane so as to form U-shaped portions having a size large enough to insert a semiconductor chip through one of these U-shaped portions. Then, a semiconductor chip is inserted through one of the U-shaped portions formed in both sides of the outer frame, the U-shaped portions being located at the sides of the leadframe-transfer path.

An eighth aspect of the present invention provides a leadframe including a die pad and leads formed in an integral fashion within an outer frame, wherein only one end portion of the die pad is connected to the outer frame so that the die pad can be bent outward from the outer frame, and so that a semiconductor chip can be die-bonded onto the die pad bent outward.

A ninth aspect of the present invention provides a method for producing a semiconductor device by using a leadframe in accordance with the eighth aspect of the present invention. In this method, after bending a die pad outward from an outer frame, a semiconductor chip is die-bonded onto the die pad bent outward. Then, the die pad with the semiconductor chip on it is bent back to the position at which the leads extending over the semiconductor chip have a predetermined constant space between the leads and the primary surface of the semiconductor chip.

A tenth aspect of the present invention provides a leadframe including a die pad and leads formed in an integral fashion in such a way that the die pad is formed in a region of the frame and the leads are formed in another region of the frame adjacent to the first region of the frame. The die pad is connected to the frame via suspending leads. One of these suspending leads is cut, and the other suspending lead is bent so that the die pad is put over the leads.

An eleventh aspect of the present invention provides a method for producing a semiconductor device using a leadframe in accordance with the tenth aspect of the present invention. In this method, after die-bonding a semiconductor chip onto a die pad, unnecessary portions of a frame around the die pad are cut off, then a suspending lead extending toward the lead area is bent into a U-shape so that the die pad with the semiconductor chip is put over the lead area with a predetermined constant space between the die pad and the extending leads.

A twelfth aspect of the present invention provides a leadframe modified from a leadframe of the tenth aspect of the present invention in such a way that the suspending lead to be cut is made longer. In a process, this suspending lead is cut in such a way that the suspending lead remains connected to the die pad. After the die pad is folded over the leads, the long suspending lead remaining connected to the die pad is bent toward the leads so as to make a connection between the end portion of this remaining suspending lead and the frame of the lead area. Thus, a firmer connection of the die pad can be achieved.

A thirteenth aspect of the present invention provides a method for producing a semiconductor device by using a leadframe in accordance with the twelfth aspect of the present invention. In accordance with this method, as described above, a die pad can be fixed more firmly to a frame of a lead area.

A fourteenth aspect of the present invention provides a die-bonding method comprising steps of: putting and pressing metal foil on a die pad; putting a semiconductor chip on the metal foil; heating these from the surroundings so as to melt the metal foil; stopping heating so as to solidify the melted metal foil so that the semiconductor chip is fixed to the die pad.

In the first aspect of the present invention, as described above, hard solder exhibiting no moisture absorption is used as a die-bonding material for die-bonding a semiconductor chip. As a result, moisture is not absorbed into the die-bonding material. Thus, it is possible to avoid corrosion of the semiconductor chip, and to avoid cracks in a package.

In the method for producing a semiconductor device in accordance with the second aspect of the present invention, and in the leadframe for use in the production of the semiconductor device in accordance with the third aspect of the present invention, after two frames are connected to each other, unnecessary portions of the frame for the die pad are cut off and removed via frame-cutting slits. As a result, during succeeding processes, the leadframe can be treated as if it comprises only one frame. As a result, production processes can be simplified and can be performed easily. In particular, leakage of plating solution can be effectively avoided.

In the leadframe and the method for producing a semiconductor device using this leadframe, in accordance with the fourth and fifth aspects of the present invention, respectively, the leadframe comprises a die pad and leads formed in an integral fashion, the die pad including a main pad and branch pads extending approximately perpendicular to the main pad, wherein the width and the area of the die pad are made larger. Each of the branch pads extends between two adjacent leads among a plurality of the leads extending inward from an outer frames, thus the existence of the branch pads causes no limitation in length and shape of the leads. Furthermore, because the width and the area of the die pad are enlarged, a semiconductor chip can be located on the die pad in a more stable manner. Moreover, improvement of the efficiency of heat conduction between the die pad and the semiconductor chip can be achieved and wire-bonding can be performed more easily.

In the sixth and seventh aspects of the present invention, regarding a leadframe and a method for producing a semiconductor device using this leadframe, respectively, a leadframe is used which includes a die pad extending in the direction perpendicular to the direction in which the leadframe is transferred during the processes for producing a semiconductor device. A semiconductor chip can be inserted between the die pad and the leads passing through one of U-shaped portions formed on both sides of the outer frame, the U-shaped portions being located on the sides of leadframe-transfer path. Thus, the chip-insertion process is simplified and can be performed easily. In addition, in a leadframe in accordance with the sixth aspect of the present invention, independently of the direction in which the die pad extends, the die pad can be sunk from the leads by bending the portions of both sides of the outer frame, at which the die pad is connected to the outer frames, into a U-shape. This makes the leads extending from one side closer to the leads extending from the other side. Thus, it is possible to make the leads reach the locations closer to the central part of the semiconductor chip.

In the eighth and ninth aspects of the present invention, regarding a leadframe and a method for producing a semiconductor device using this leadframe wherein the leadframe includes a die pad and leads formed in an integral fashion, the die pad can be bent outward from the outer frame. In this situation in which the die pad is bent outward, a semiconductor chip can be die-bonded onto this die pad. This allows a simpler and easier die-bonding process, compared to the case where a semiconductor chip is inserted between a die pad and leads.

In the tenth and eleventh aspects of the present invention, regarding a leadframe and a method for producing a semiconductor device using this leadframe wherein the leadframe includes a die pad and leads formed in an integral fashion, a semiconductor chip can be easily die-bonded to the die pad without any additional special process.

In the twelfth and thirteenth aspects of the present invention, regarding a leadframe and a method for producing a semiconductor device using this leadframe, the die pad can be connected to a frame for leads more firmly by modifying the above leadframe and method in accordance with the tenth and eleventh aspects of the invention in such a way that a suspending lead portion remaining connected to the die pad is bent and is further connected to the frame for leads. Thus, the succeeding processes after that can be performed more easily and more accurately.

In the die-bonding method in accordance with the fourteenth aspect of the present invention, a metal foil such as solder disposed between a die pad and a semiconductor chip is heated from the surroundings so as to melt the metal foil. Thus, this method allows easier die-bonding process, and it provides a significant advantage in particular for the case where die-bonding is performed after a semiconductor chip is inserted between the die pad and inner lead portions.

DESCRIPTION OF THE PREFERRED EMBODIMENTS

Now, referring to the accompanying drawings, the preferred embodiments will be described below.

The First Aspect of the Invention

Figure 1A:
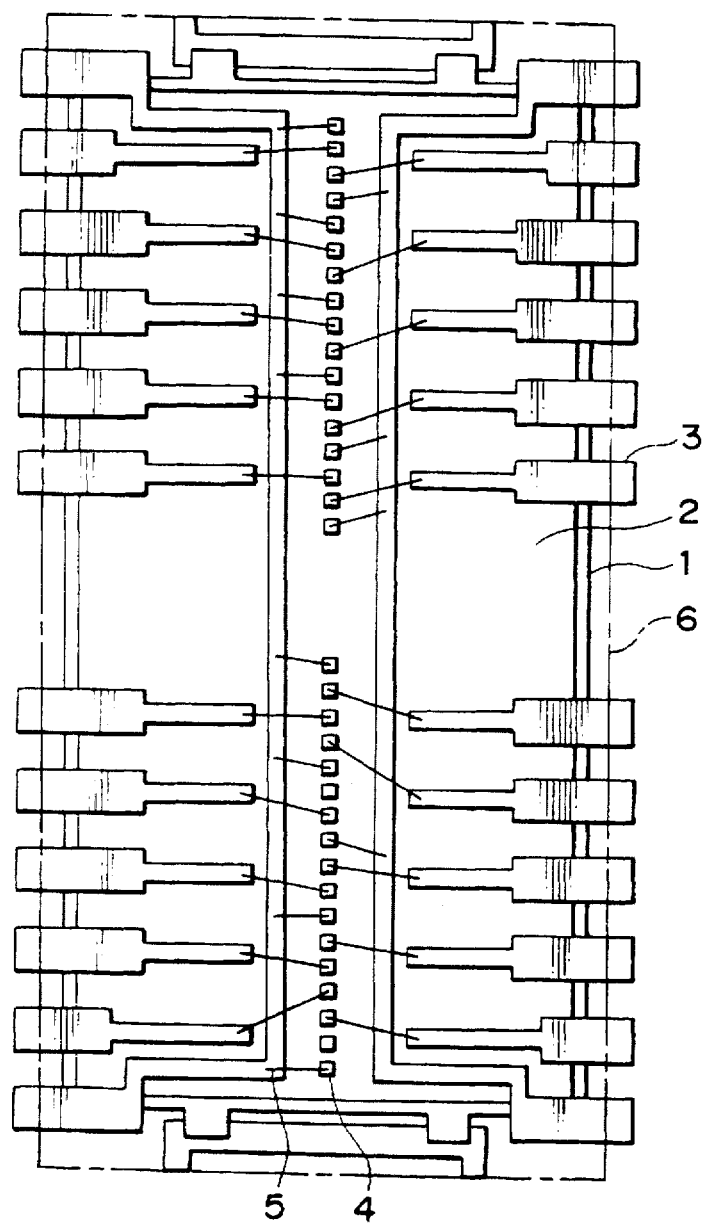
FIG. 1A is a plan view of one embodiment of a semiconductor device in accordance with a first aspect of the present invention.
Figure 1B:
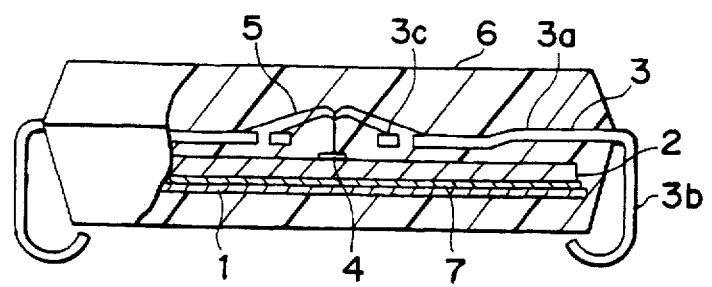
FIG. 1B is a side view, partially cross sectioned, of the semiconductor device of FIG. 1A.

FIGS. 1A and 1B show an embodiment of a semiconductor device having a LOC-structure in accordance with the first aspect of the present invention, wherein FIG. 1A is a plan view showing inner structure and FIG. 1B is a side view, partially cross sectioned, of the device. As shown in these figures, the device comprises a die pad 1, a semiconductor chip 2, leads 3 having an inner lead portion 3a and an outer lead portion 3b, electrodes 4, thin metal wires 5, and molding resin 6 forming a package. This device has substantially the same structure as that of conventional semiconductor devices except that the electrodes 4 located along a straight line in a central part of the semiconductor chip.

There are also provided common leads 3c primarily used for supplying electrical power or used as a ground lead, wherein the common leads 3c extend over the central portion of the semiconductor chip 2 in the longitudinal direction. In addition, hard solder 7 such as conventional solder is also provided for die-bonding the semiconductor chip 2 to the die pad 1. The hard solder 7 exhibits no moisture absorption, thus there is no possibility that moisture will corrode the semiconductor chip 2. Furthermore, there is no possibility that moisture brings about cracks in a package, even if the whole device is heated when a completed semiconductor device is attached to a circuit board (not shown) by soldering the outer lead portions 3b. Because the hard solder material 7 for connecting the semiconductor chip 2 to the die pad is disposed in an inner portion covered with molding resin 6, less heat is provided to this hard solder material 7 than to the external portions. Thus, the hard solder material 7 does not melt during the soldering process. If necessary, the hard solder material 7 may be selected so that it has a melting point high enough not to be melted during soldering process for mounting the semiconductor device on a circuit board. In the case of conventional solder, this result can be achieved by selecting the mixture ratio between tin and lead.

The Second and Third Aspects of the Invention

Figure 2:
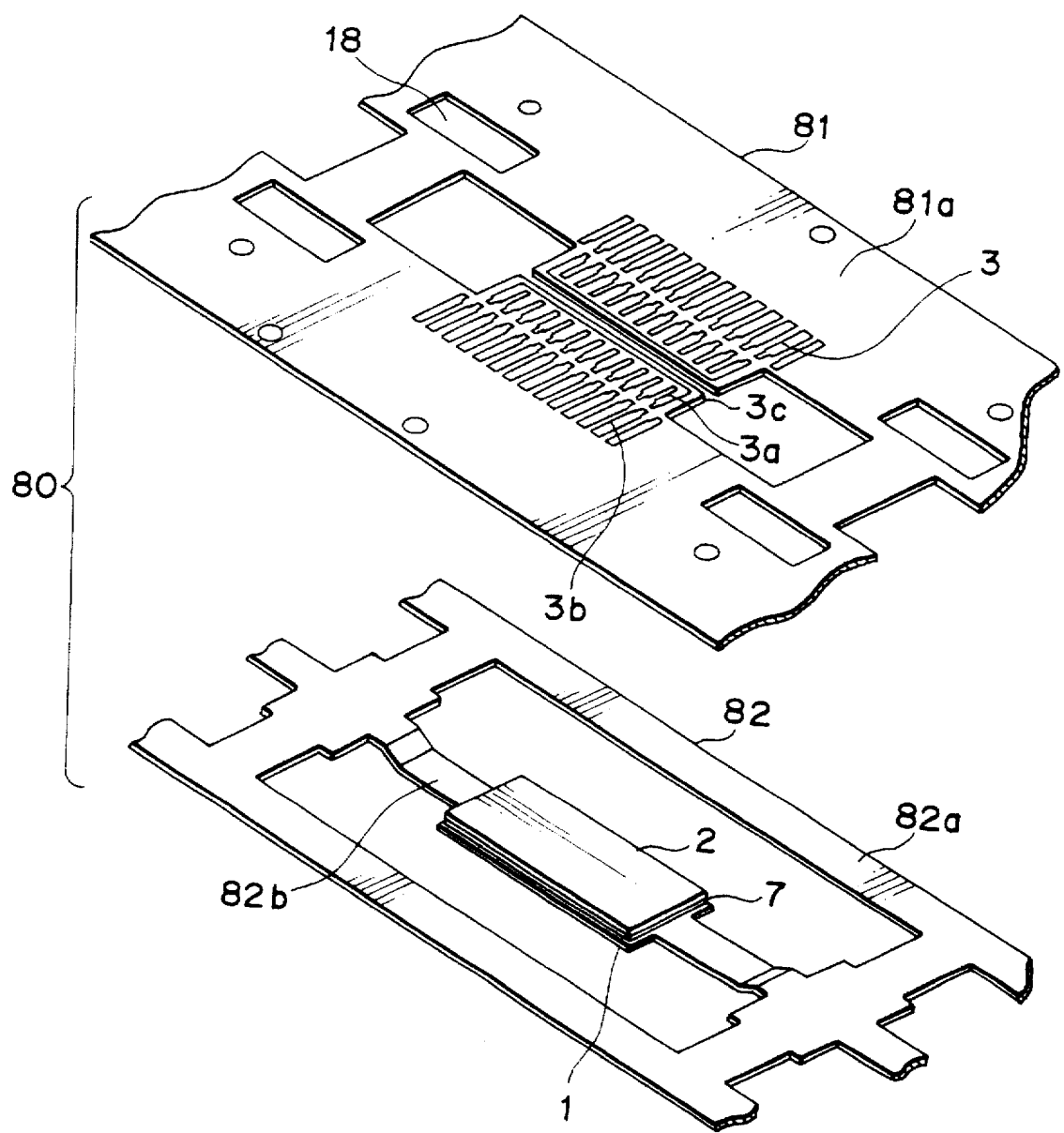
FIG. 2 is a perspective view showing the structure of a leadframe relating to second and third aspects of the present invention.

FIG. 2 shows a leadframe comprising two frames in accordance with the second and third aspects of the present invention. The second aspect of the present invention relates to a method for producing a semiconductor chip using a leadframe, and the third one relates to the leadframe itself. As shown in FIG. 2, a leadframe 80 comprises a frame 81 for leads and a frame 82 for a die pad for use in the present invention. These frames 81 and 82 are each produced from one metal sheet by means of punching or etching. The frame 81 for leads comprises common leads 3c and a plurality of leads 3 extending inward from both sides of the outer frame 81a. Each of the leads 3 comprises an inner lead portion 3a and an outer lead portion 3b. The frame 81 for leads has frame-cutting slits 18 formed in the outer frame 81a. The frame-cutting slits 18 will be described later in more detail. The frame 82 for die pad includes a die pad 1, both sides of the die pad 1 being connected to inner portions of an outer frame 82a via suspending leads 82b. The die pad 1 is formed in a shape similar to the shape of a semiconductor chip 2 to be die-bonded so that the semiconductor chip 2 can be fixed onto the die pad in a more stable manner. The semiconductor chip 2 is die-bonded to the die pad 1 via a hard solder material 7, as shown in FIG. 2. In the frame 82 for a die pad, the suspending leads on the both sides are bent by an amount determined by taking the thickness of the semiconductor chip 2 into account, so that the die pad 1 is sunk from the surrounding outer frame 82a. Thus, when the frames 81 and 82 are connected to each other, the common leads 3c and the inner lead portion 3a of each lead 3 extend over and parallel to the primary surface of the semiconductor chip 2, with a predetermined constant spacing between the leads and the surface of the semiconductor chip 2. The method of connection between the frame 81 for leads and the frame 82 for a die pad will be described later.

In known technologies, a die pad is formed in an integral fashion between common leads 3c or between inner lead portions 3a extending from the both sides of an outer frame 81a of a frame 81 for leads. However, in such a frame, the width of the die pad 1 cannot be widened beyond the region of the leads. In contrast, in this specific aspect of the present invention, wherein two frames, that is, a frame 81 for leads and a frame 82 for a die pad, are connected to each other, the shape of die pad 1 can be designed independently of the shape of leads, thus the width of the die pad 1 can be widened, as required. A semiconductor chip 2 may be also die-bonded in a different way such that after two frames 81 and 82 are connected to each other, the semiconductor chip 2 is between the die pad 1 and the inner lead portions 3a, and fixed to the die pad 1.

Figure 3A:
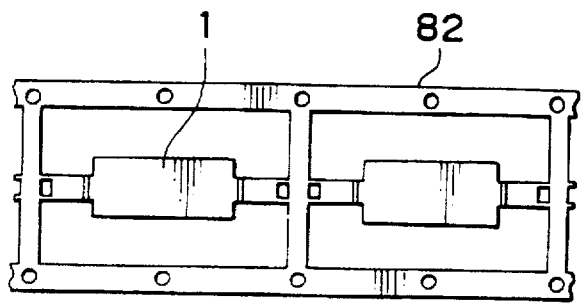
FIGS. 3A–3C are plan views of a semiconductor device for explanation of one embodiment of successive production steps in accordance with a second aspect of the present invention.
Figure 3B:
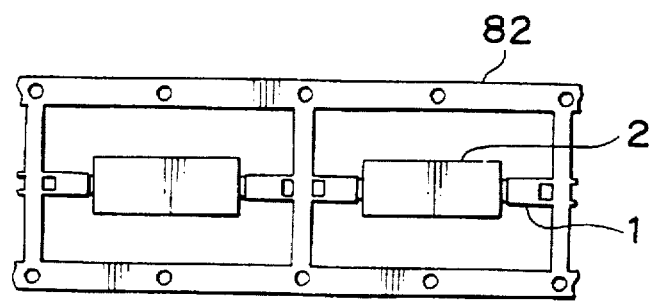
Figure 3C:
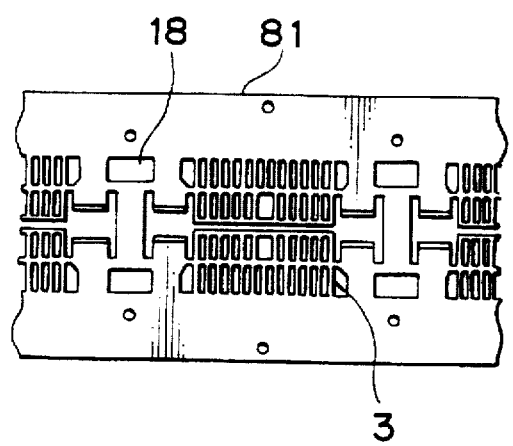
Figure 4A:
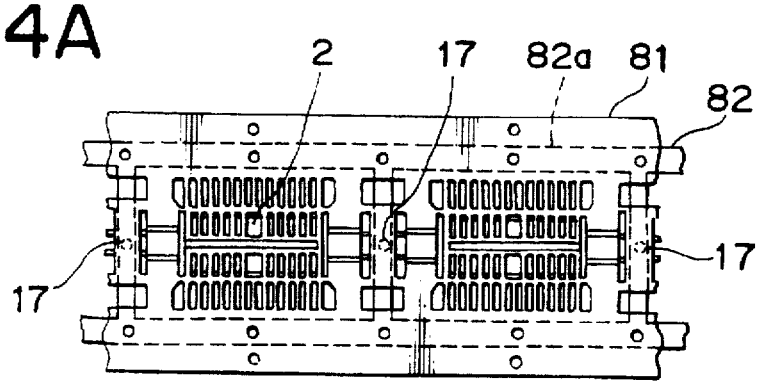
FIGS. 4A–4D are plan views of a semiconductor device for explanation of further successive production steps following the step in FIG. 3C.
Figure 4B:
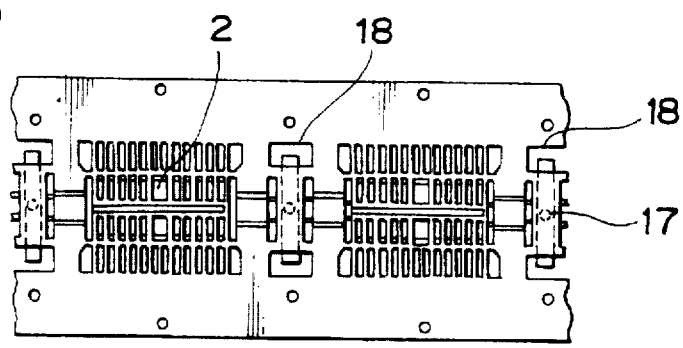
Figure 4C:
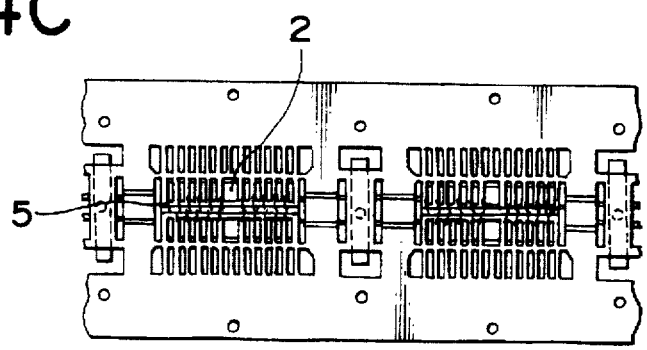

A method for producing a semiconductor device in accordance with the second aspect of the present invention is illustrated in FIGS. 3A–3C and FIGS. 4A–4D. A flowchart of this production method is also shown in FIG. 5. Now, the successive steps of this method will be described next. First, a semiconductor chip 2 is fixed to a die pad 1 of a frame 82 for die pad shown in FIG. 3A, using a hard solder material 7 such as conventional solder exhibiting no moisture absorption (See FIGS. 1 and 2). Now, the situation becomes as shown in FIG. 3B (die-bonding step S1). Then, a frame 81 for leads having frame-cutting slits 18 as shown in FIG. 3C is put on the frame 82 for a die pad which is the situation as shown in FIG. 3B, and the frames are connected to each other as shown in FIG. 4A, by one of methods (for example, spot welding) which will be described later (connecting step S2).

Then, an unnecessary outer frame 82a of the frame 82 for a die pad is cut off by means of die-cutting. Thus, the die pad 1 with the semiconductor chip 2 remains connected to connecting portions 17 on both sides (outer-frame cutting-off step S3). After that, the resultant combined frames can be treated as a leadframe, and the successive production processes can be performed easily. Moreover, this results in elimination of the possibility of accumulation or leakage of plating solution used in a later process of exterior-plating. Then, electrodes 4 (see FIG. 1) located along the center line of the semiconductor chip 2 are electrically connected via the thin metal wires 5 to the inner lead portions 3a and/or the common leads 3c extending over the chip 2 (wire-bonding step S4).

Figure 4D:
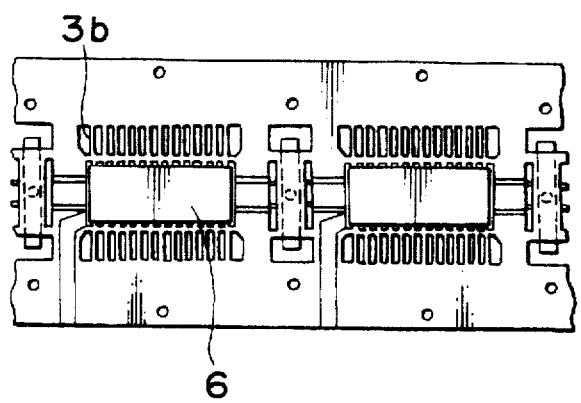
Figure 5:
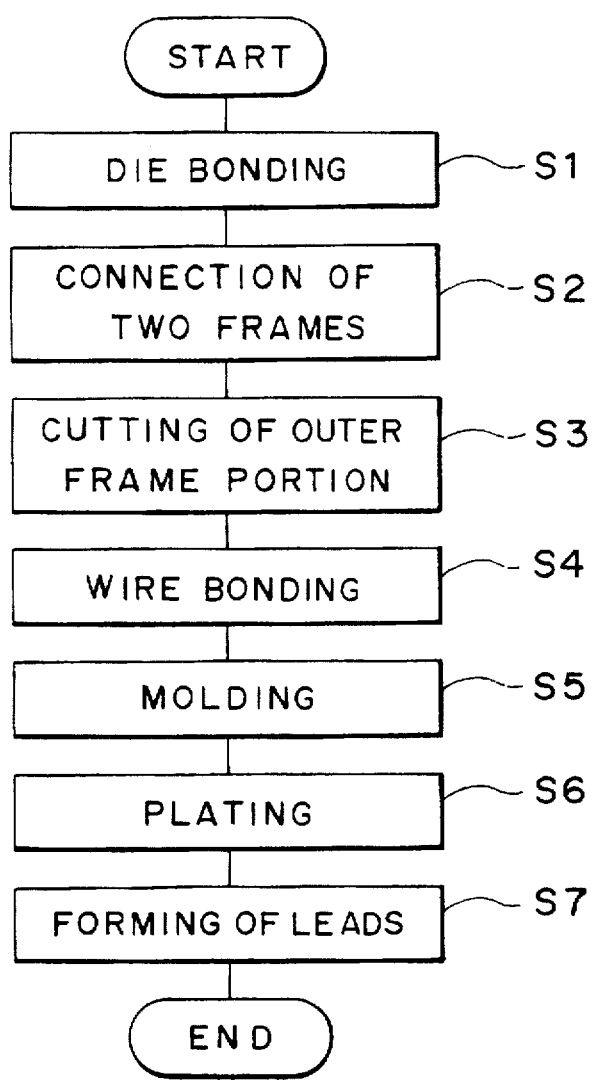
FIG. 5 is a flowchart showing a method for producing a semiconductor device according to FIGS. 3A–3C and FIGS. 4A–4D.

After wire-bonding is performed, the frame is put into a mold (not shown), then resin is injected into the mold to seal the main pad including the semiconductor chip 2 with molding resin 6 as shown in FIG. 4D (molding step S5). In this step, molding is performed in such a way that the outer lead portions 3b are not covered with the resin but are exposed to the outside. The following steps are not shown in figures, but the outer lead portions 3b are exterior-plated (exterior-plating step S6), then the semiconductor device including the outer lead portions 3b are cut off from the frame and tie-bars are also cut off so as to separate the outer lead portions 3b into individual leads. Furthermore, the separated outer lead portions 3b are formed into a desired shape in lead forming step S7, so that a completed semiconductor device is obtained.

The frame-cutting slits 18 may be formed in any one of two frames. The shape of the slits is not limited to that shown in figures. Instead of die-cutting, laser cutting or the like may be used for the same purpose for cutting off the outer-frame portion of the frame 82 for die pad. In this specific example in accordance with the first aspect of the present invention, the semiconductor chip 2 is die-bonded with a hard solder material 7, however other materials may be used not only in this first aspect but also in any of the other aspects of the present invention.

Figure 6:
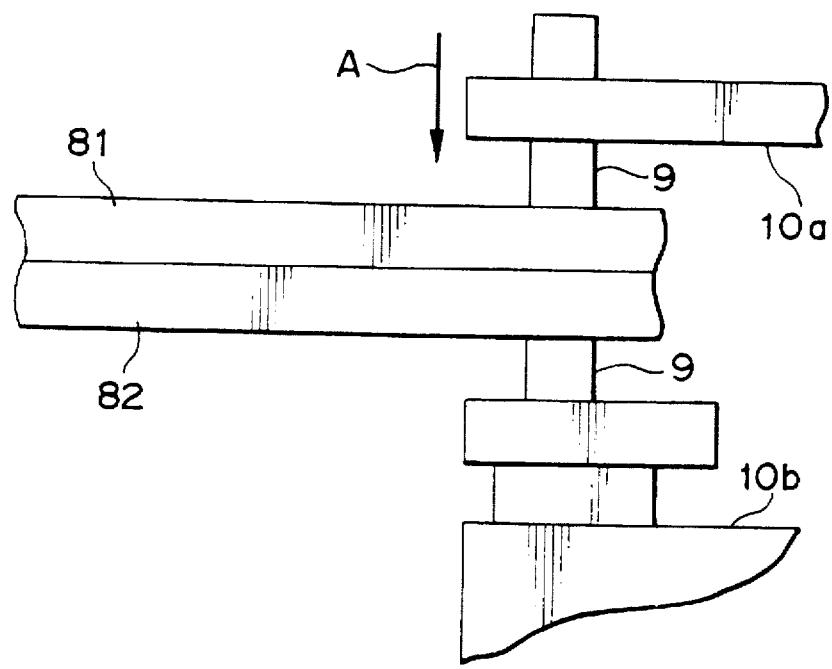
FIG. 6 is a side view for explanation of a first embodiment of a method for connecting two frames in accordance with the second aspect of the present invention.

Now, in accordance with the second aspect of the present invention, there will be described some examples of the methods for connecting a frame 81 for leads to a frame 82 for a die pad. FIG. 6 shows a first embodiment of a method for connecting a frame 81 for leads to a frame 82 for a die pad. In this embodiment shown in FIG. 6, connection is performed by means of resistance welding which is one of the spot-welding techniques. In this figure, there are shown welding electrodes 9, an electrode-holding bar 10a for holding the upper welding electrode 9, and an electrode-holding base 10b for holding the lower welding electrode 9. A frame 81 for leads and a frame 82 for a die pad are put between the upper and lower welding electrodes and pressed by them by moving the electrode-holding bar 10a in the direction denoted by the arrow A in FIG. 6. By supplying a current between the upper and lower welding electrodes 9, the frames 81 and 82 are spot-welded. Resistance welding has the advantages that large bonding strength can be obtained and that only little deformation occurs at the surface of a welded portion. Another great advantage of resistance welding is that welding dust is not generated, thus extremely little contamination occurs to the semiconductor chip 2. Spot welding can be also performed by means of laser welding.

Figure 7:
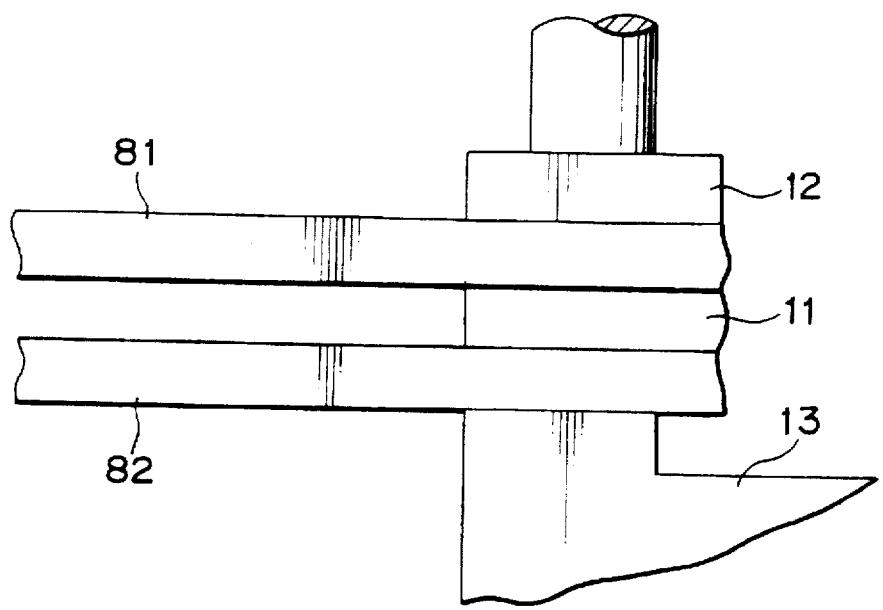
FIG. 7 a side view for explanation of a second embodiment of a method for connecting two frames in accordance with the second aspect of the present invention.

FIG. 7 shows a second embodiment of a method for connecting a frame 81 for leads to a frame 82 for a die pad. In this embodiment shown in FIG. 7, connection is performed by using an adhesive tape. In this figure, there are shown an adhesive tape 11, a pressing fixture 12, and a frame-holding base 13. An adhesive tape 11 is placed between frame 81 for leads and a frame 82 for a die pad, and these frames 81 and 82 with the adhesive tape 11 are put on the frame-holding base 13 and are pressed by the pressing fixture 12 so that both frames 81 and 82 are connected to each other via the adhesive tape 11. This method has an advantage over a laser welding technique that it can offer high throughput and also has an advantage over a spot welding technique that there is no need for maintenance of equipment.

Figure 8:
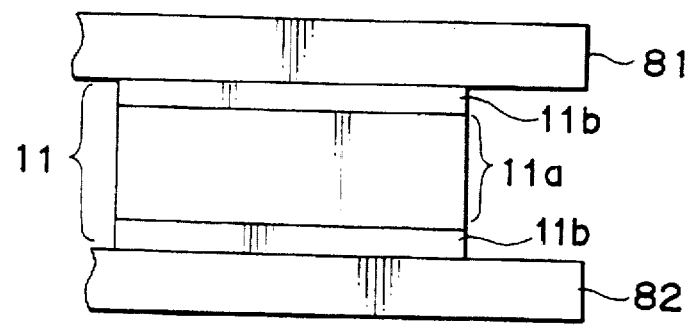
FIG. 8 is a side view for explanation of a third embodiment of a method for connecting two frames in accordance with the second aspect of the present invention.

FIG. 8 shows a third embodiment of a method for connecting a frame 81 for leads to a frame 82 for a die pad. In this embodiment shown in FIG. 8, connection is also performed using an adhesive tape in a similar way to that of FIG. 7, however, in this case, the adhesive tape 11 comprises an adhesive tape base 11a and thermoplastic adhesives 11b on both of its surfaces. In this embodiment, each surface of the adhesive tape 11 is bonded to the frame 81 or frame 82 via an interfacial material of thermoplastic adhesive 11b. As a result, even if a thermal history is introduced during processing steps such as wire-bonding and molding (sealing), the thermoplastic adhesives 11b absorb the stress introduced by the difference in thermal expansion between frames 81 and 82, thus the total thermal deformation of the frames can be minimized. Although an adhesive tape is used in these connecting methods shown in FIGS. 7 and 8, the connection is performed outside of the area to be molded with molding resin 6. Thus, even if the adhesive tape exhibits moisture absorption, no problem will occur.

Figure 9A:
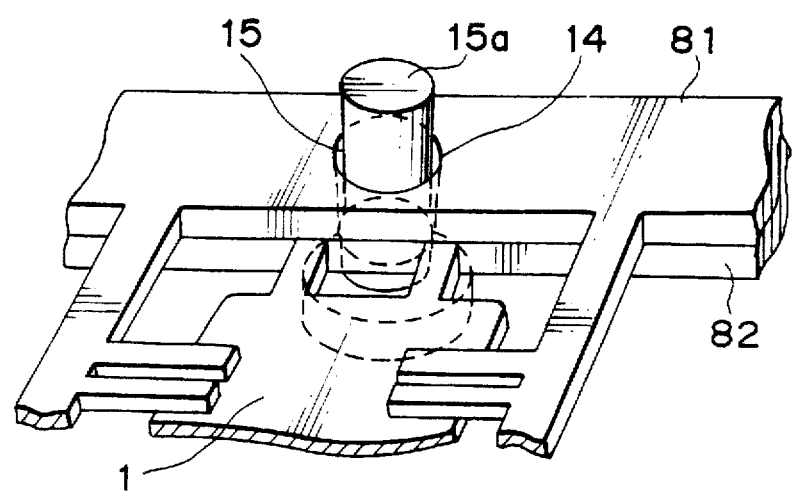
FIGS. 9A and 9B are perspective views for explanation of a fourth embodiment of a method for connecting two frames in accordance with the second aspect of the present invention.
Figure 9B:
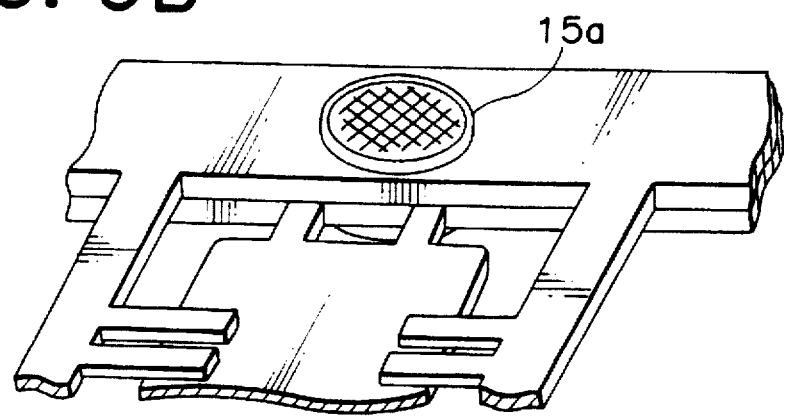

FIGS. 9A and 9B show a fourth embodiment of a method for connecting a frame 81 for leads to a frame 82 for a die pad. In this embodiment, connection is performed using a rivet. In these figures, there are shown holes 14 in each of the frames 81 and 82, and a rivet 15. As shown in FIG. 9A, two frames 81 and 82 are put one on top of the other, then a rivet 15 is inserted through holes 14. Then, the upper end of the rivet 15 is pressed and spread out so as to fasten two fitted frames 81 and 82. The shapes of the rivet 15 and holes 14 are not limited to those shown in figures. Instead of the rivet 15, any other element having similar function may be used.

Figure 10A:
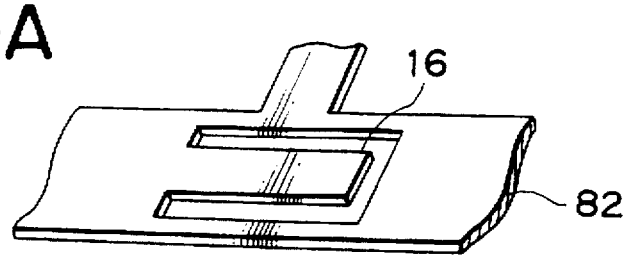
FIGS. 10A–10D are perspective views for explanation of a fifth embodiment of a method for connecting two frames in accordance with the second aspect of the present invention.
Figure 10B:
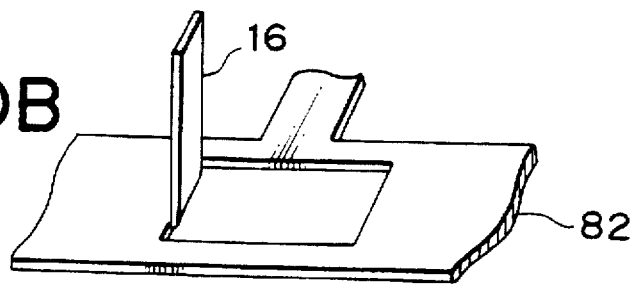
Figure 10C:
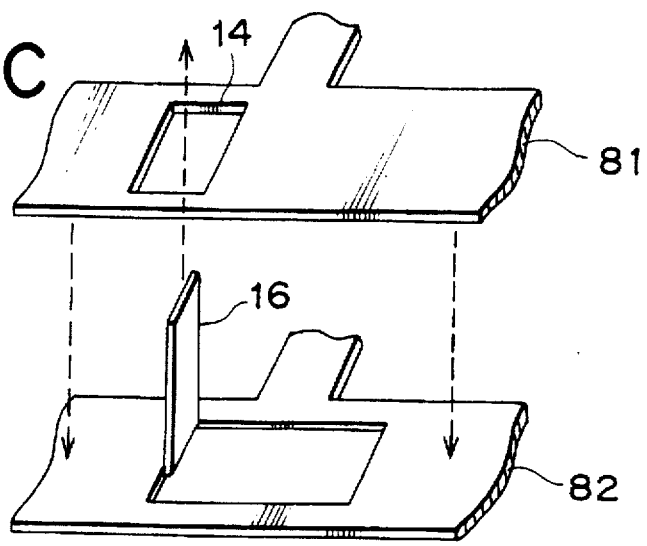
Figure 10D:
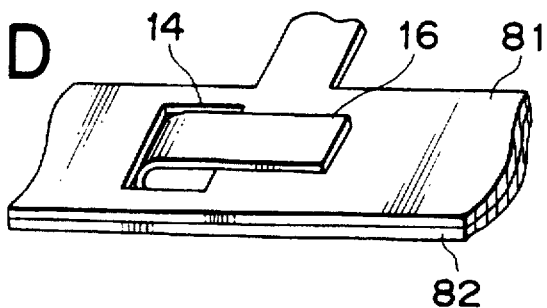

FIGS. 10A–10D show a fifth embodiment of a method for connecting a frame 81 for leads to a frame 82 for a die pad. In this embodiment, connection is performed by means of caulking. In these figures, there are shown a projection 16 on a frame 82, a hole 14 in a frame 81, wherein the projection 16 is to be fitted into the hole 14. First, a projection is formed on a frame 82 as shown in FIG. 10A by means of etching or punching. Then, the projection 16 is bent upward as shown in FIG. 10B. A hole 14 corresponding to the projection 16 is formed in a frame 81 by means of etching or punching. One of two frames 81 and 82 is put on the other in such a way that the projection 16 is inserted and fitted in the hole 14. Then, the projection 16 is bent back as shown in FIG. 10D. Thus, the frames 81 and 82 are fitted and fastened by means of calking. The shapes of the projection 16 and the hole 14, and the method for forming them are not limited to those described above.

Figure 11:
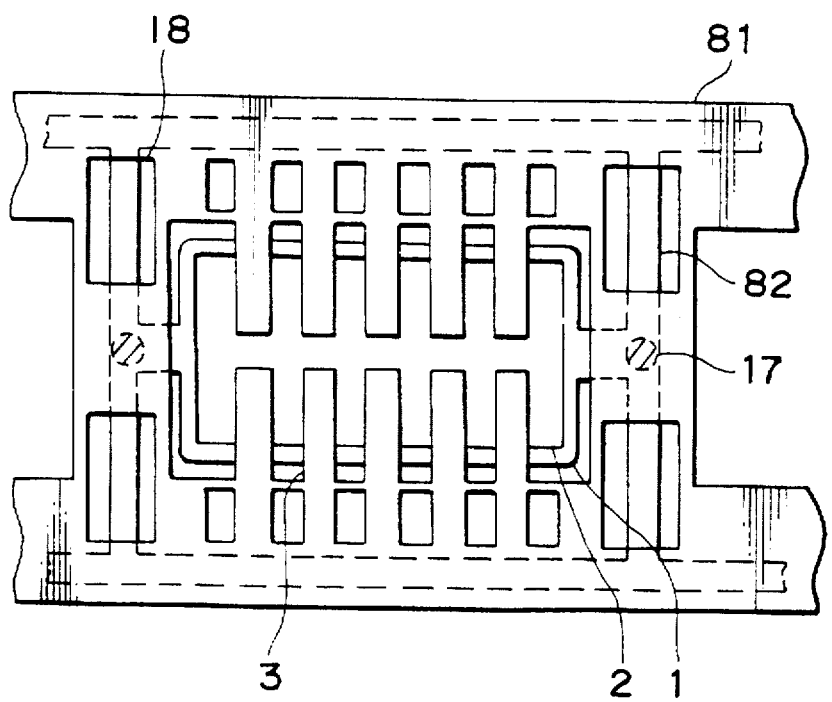
FIG. 11 is a plan view of two frames for use in the second aspect of the present invention, the two frames being connected to each other.
Figure 12A:
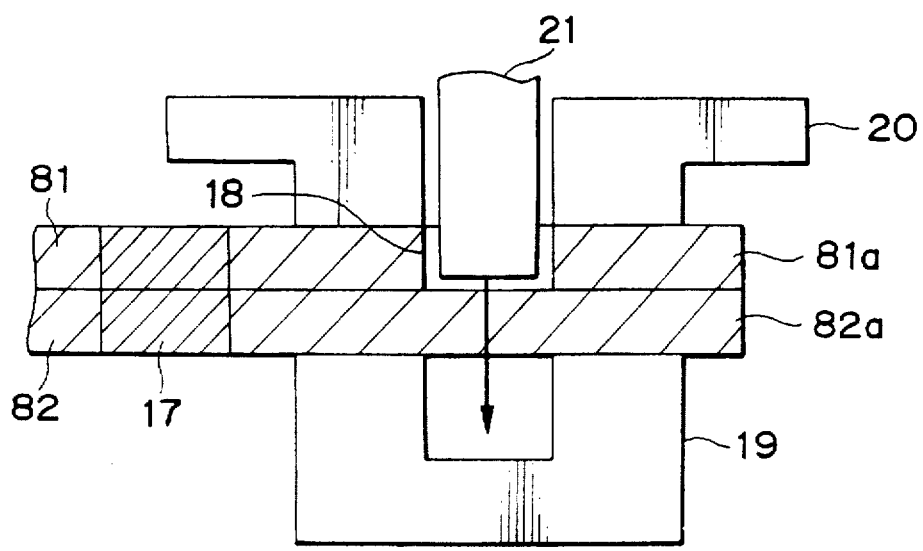
FIGS. 12A and 12B are side views for explanation of one example of methods for cutting a frame with regard to a production method in accordance with the second aspect of the present invention.
Figure 12B:
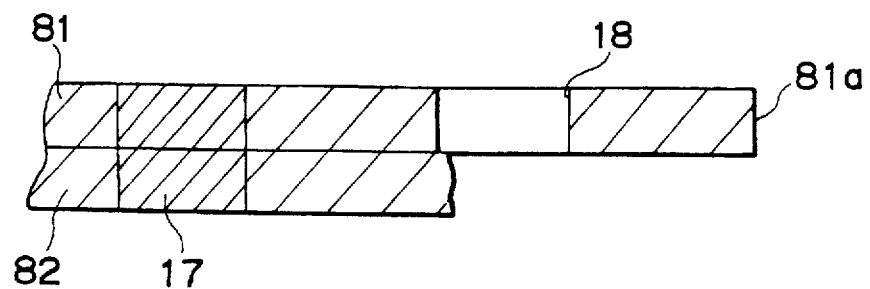

FIGS. 11, 12A and 12B show one embodiment of a method for cutting off an unnecessary portion of an outer frame part 82a of a frame 82 for a die pad which has been fastened to a frame 81 for leads by means of any method described above. FIG. 11 shows a frame 82 for die pad with a semiconductor chip mounted on a die pad, the frame 82 for a die pad being connected to the bottom of a frame 81 for leads. In this figure, there are shown connecting portions 17 (for example, spot welding portions) at which the frames are connected to each other, and frame-cutting slits 18 in the frame 81 for leads.

The frame-cutting slits 18 in the frame 81 for leads as described above offer a means for cutting off the frame 82 for die pad except for a die pad 2 (including suspending leads) connected to the frame 81 at connecting portions 17 on both sides. As a result of the cutting, the frame 81 having the die pad 1 with the semiconductor chip 2 can be treated almost like a single sheet frame. Thus, during the succeeding processes, problems such as miss-transfer of frames, and accumulation and leakage of solution which often occur in two combined frames can be effectively avoided.

This cutting method is shown in FIGS. 12A and 12B where a lower metal fixture is denoted by 19, a frame holder by 20, and a cutting metal element by 21. As shown in FIG. 12A, the frame 81 for leads and die pad frame 82 which are connected to each other at the connecting portion 17 are put on the lower metal fixture 19 and held by the frame holder 20. The cutting metal element 21 is inserted into the frame-cutting slits 18 down to a position at which the cutting metal element 21 stops with a predetermined adequate gap from the lower metal fixture 19. Thus, the outer frame of the frame 82 for die pad is cut off from the frame 81 for leads.

As described previously, one known method for producing a semiconductor device having LOC-structure is to use a one-sheet leadframe having leads and a die pad formed in an integral fashion. Such a frame can be produced from a sheet of metal by means of cutting such as punching or etching. Although this method has an advantage that fewer processing steps are required for producing a semiconductor device compared to the case where two frames are combined, it has disadvantages that because of its structure it is difficult to expand the width of a die pad exceed a lead area, and that a semiconductor chip cannot be die-bonded on a die pad in a stable fashion. Now, to solve such problems, in accordance with the fourth aspect of the present invention, a leadframe for use in a semiconductor device having a LOC-structure as well as a method in accordance with the fifth aspect of the present invention for producing a semiconductor device having LOC-structure using such a leadframe will be described below.

The Fourth and Fifth Aspects of the Invention

Figure 13:
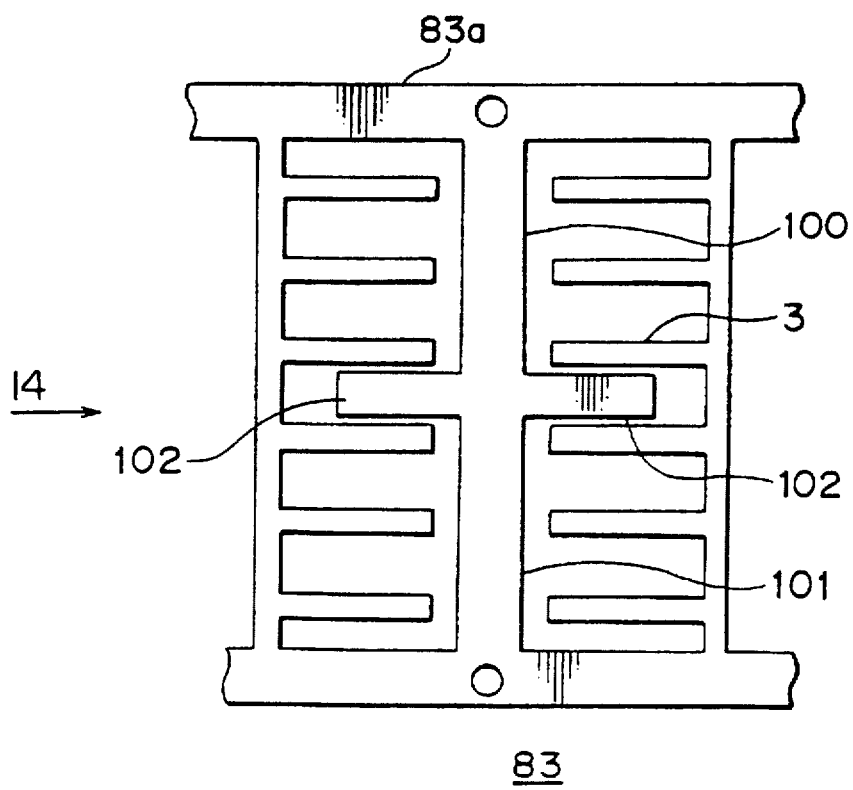
FIG. 13 is a plan view showing one embodiment of a leadframe relating to a fourth and fifth aspects of the present invention.
Figure 14:
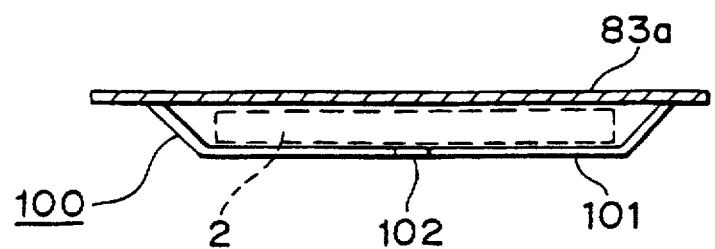
FIG. 14 is a side view of the leadframe of FIG. 13, seen in the direction of the arrow XIV of FIG. 13.

FIGS. 13 and 14 show an example of a leadframe in accordance with the fourth and fifth aspects of the present invention, wherein FIG. 13 is a top view and FIG. 14 is a side view seen in the direction denoted by an arrow XIV in FIG. 13. As shown in FIG. 13, this leadframe 83 comprises a plurality of leads 3 inside of an outer frame 83a and also comprises a die pad 100 extending in the direction approximately perpendicular to the leads 3, the leads 3 and the die pad 100 being unitary. The die pad 100 comprises a conventional type of main pad 101 extending along the area corresponding to a central area of a semiconductor chip 2 in a range of its full length, and further comprises branch pads 102 extending from both sides of the main pad 101 in a cross shape. Thus, the width of the die pad is substantially widened. Each branch pad 102 is in the same plane 95 the main pad 101, and extends approximately perpendicular to the main-pad 101. Furthermore, each branch pad 102 extends between neighboring leads among a plurality of leads 3 extending inward from both sides of the outer frame 83a at a predetermined interval. Because of such a structure, the die pad 100 can be widened, exceeding the lead area, without modifying the location, shape, and/or length of leads 3. As shown in FIG. 14, the die pad 100 is sunk from the outer frame 83a, and a semiconductor chip 2 is die-bonded onto the sunk die pad 100 with, for example, hard solder.

Figure 15:
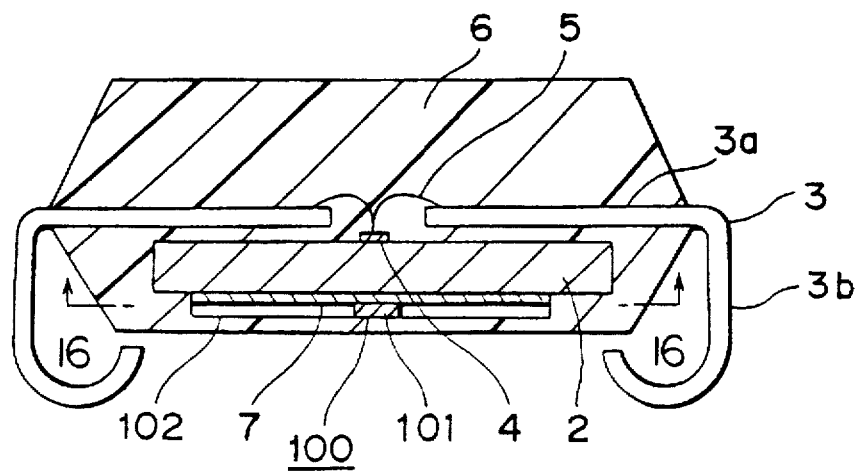
FIG. 15 is a cross sectional view showing one embodiment of a semiconductor device produced by a production method in accordance with the fifth aspect of the present invention.
Figure 16:
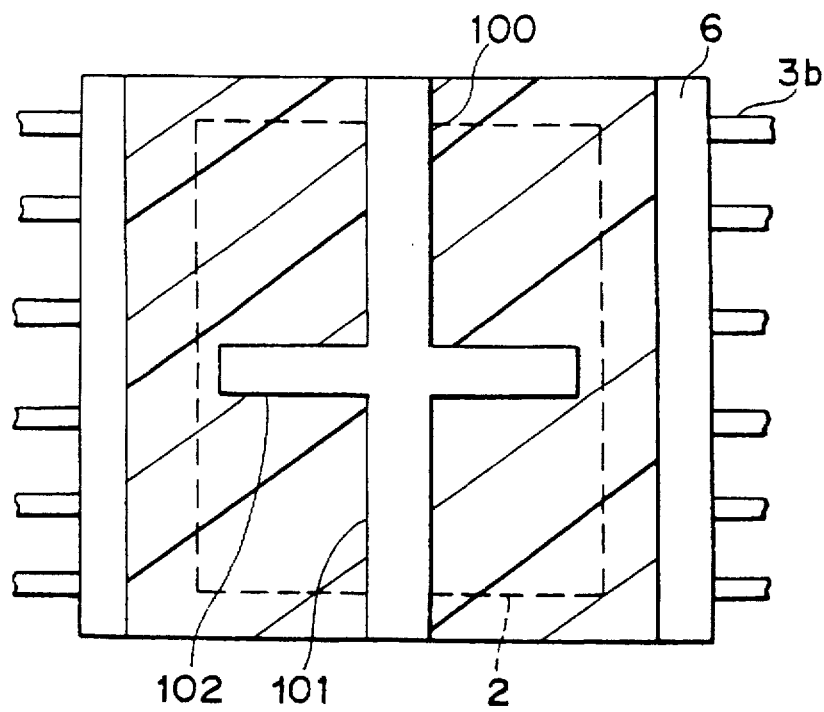
FIG. 16 is a cross section of the semiconductor device of FIG. 15, taken along the lines XVI—XVI of FIG. 15.

FIGS. 15 and 16 show a semiconductor device produced by a production method in accordance with the fifth aspect of the present invention, using a leadframe shown in FIG. 13. FIG. 15 is a cross sectional view taken along a lead 3 of the semiconductor device. FIG. 16 is a cross sectional view taken in the line XVI–XVI of FIG. 15. The basic structure is the same as that of a semiconductor device in accordance with the first aspect of the present invention shown FIG. 1, thus the same or similar portions are denoted by the same numerals. Explanation will not be repeated again for these same or similar portions. In the semiconductor device shown in FIGS. 15 and 16, there are provided only leads 3 extending over the semiconductor chip 2 and there are no common leads 3. The flowchart showing this production method will be the same as that in accordance with the second aspect of the present invention shown in FIG. 5 except that steps S2 and S3 are deleted.

Now, the method for producing a semiconductor device shown in FIGS. 15 and 16 will be described. As described above in connection with FIG. 14, a semiconductor chip 2 is inserted between the outer frame 83a of the leadframe 83 and the sunk die pad 100. Then, the semiconductor chip 2 is attached to the die pad 100 with for example, hard solder 7 (die bonding step S1). As shown in FIG. 15, each of leads 3 floats without contact with the upper surface of the semiconductor chip 2.

Then, inner lead portions 3a of the leads 3 extending over the semiconductor chip 2 ate each connected to electrodes 4 on the semiconductor chip 2 with thin metal wires 5 by means of ultrasonic-thermocompression wire-bonding (wire bonding step S4). In this step, when a thin metal wire 5 is compressed onto an electrode 4 on the semiconductor chip 2, mechanical force is applied to the semiconductor chip 2. However, due to the good stability of the semiconductor chip 2 die-bonded to the die pad 100, it is ensured that wire bonding can be performed easily with no problems. During the wire-bonding process, the die pad is heated so as to raise the temperature of the semiconductor chip 2 for easier wire bonding. Because the die pad 100 has a larger area than a conventional leadframe having leads and a die pad formed in an integrated fashion, better thermal conduction can be achieved from the die pad 100 to the semiconductor chip 2. Thus, the temperature of the semiconductor chip 2 can be raised more effectively.

Then, the semiconductor chip 2, the die pad 100, the inner lead portions 3a, and thin metal wires 5 are encapsulated with, for example, epoxy resin into one body by means of transfer molding, thus molding resin 6 is completed (molding step S5). Each outer lead portion 3b extending outward from the molding resin 6 is exterior-plated (exterior plating step S6). Finally, an assembled semiconductor device is separated from the outer frame 83a of the leadframe 83, then each outer lead portion 3b extending outward from the molding resin 6 of the semiconductor device is formed into a desired shape (lead forming step S7). Thus, a completed semiconductor device is obtained. A leadframe 83 used in actual production comprises a plurality of unit elements such one shown in FIG. 13, the unit elements being successively connected to each other, and a plurality of semiconductor devices are produced at a time in a similar way to that of the second aspect of the present invention. If unnecessary, exterior plating may not be performed, not only in this specific production method but in any of production methods which will be described later.

In the completed semiconductor device as in FIGS. 15 and 16, unlike semiconductor devices produced by using a conventional one-sheet frame, the back surface of the semiconductor chip 2 has a smaller area in direct contact with the molding resin 6, thus better adhesion is achieved between the back surface of the semiconductor chip 2 and the molding resin 6, and separation is avoided.

In the above specific embodiment, the die pad 100 has a shape of across. However, the branch pad 102 may be formed only on one side of the main pad 101 of the die pad 100. In contrast to this, in a leadframe 83 shown in FIG. 17, each side of a main pad 101 of a die pad 100 has a plurality of branch pads 102 extending from each side. Each branch pad 102 of this leadframe 83 extends between neighboring leads 3. By using such a leadframe 83 having a die pad 100 with a larger number of branch pads 102, the stability of the semiconductor chip and thermal conduction efficiency during the wire bonding process step are improved. Furthermore, a completed semiconductor device exhibits better adhesion between the back surface of a semiconductor chip and molding resin.

As described above in connection with FIGS. 13 and 17, in a leadframe in accordance with the fourth aspect of the present invention, a die pad 100 extends in the direction perpendicular to the longitudinal direction of a leadframe 83 (actual leadframe comprises a plurality of unit elements shown in these figures, the unit elements being successively connected in the horizontal direction of these figures). Therefore, to insert a semiconductor chip 2 between a die pad 100 and an outer frame 83a, the chip 2 is inserted in the longitudinal direction of the leadframe 83 (the direction denoted by the arrow XIV in FIG. 13). In production lines, in general, leadframes are transferred in the longitudinal direction of the leadframes. This means that there is difficulty in chip-insertion process due to the fact that semiconductor chips are inserted in the same direction as that of the leadframe-transfer path in the case of the leadframe 83 shown in FIGS. 13 and 17.

Figure 18:
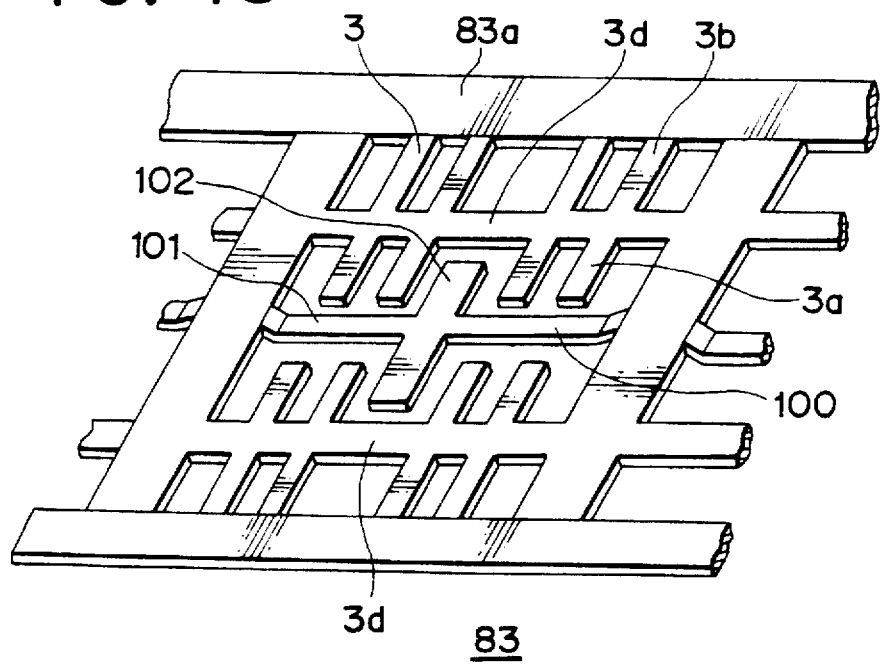
FIG. 18 is a perspective view showing another embodiment of a leadframe in accordance with the fourth aspect of the present invention.

In view of the above, another embodiment is provided in accordance with the fourth aspect of the present invention as is shown in FIG. 18. In the case of a leadframe 83 shown in FIG. 18, a main pad 101 of a die pad 100 extends in a longitudinal direction of the leadframe 83, that is, in the same direction as that in which the leadframe 83 is transferred, and each lead 3 extends perpendicular to this direction. Both end portions of the die pad 100 are bent such that the die pad 100 is sunk from the outer frame 83a. Thus, a semiconductor chip can be inserted from a side position of the leadframe-transfer path, that is, in the direction perpendicular to the leadframe-transfer path, as shown by the arrow B. In this way, an easier chip-insertion process is achieved. In FIG. 18, there are shown tie-bars 3d for connecting leads 3 to each other, which are not shown in figures for previous embodiments. These tie-bars 3d are cut off and separated into individual outer leads 3b in lead cutting and forming process in which the semiconductor device is also separated from the outer frame 83a.

The Sixth and Seventh Aspects of the Invention

Figure 17:
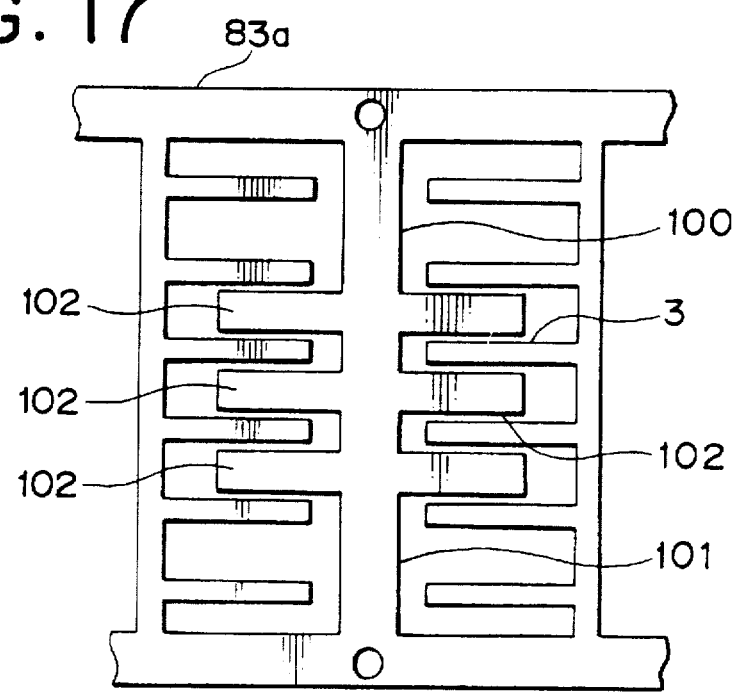
FIG. 17 is a plan view showing another embodiment of a leadframe relating to the fourth and fifth aspects of the present invention.
Figure 19:
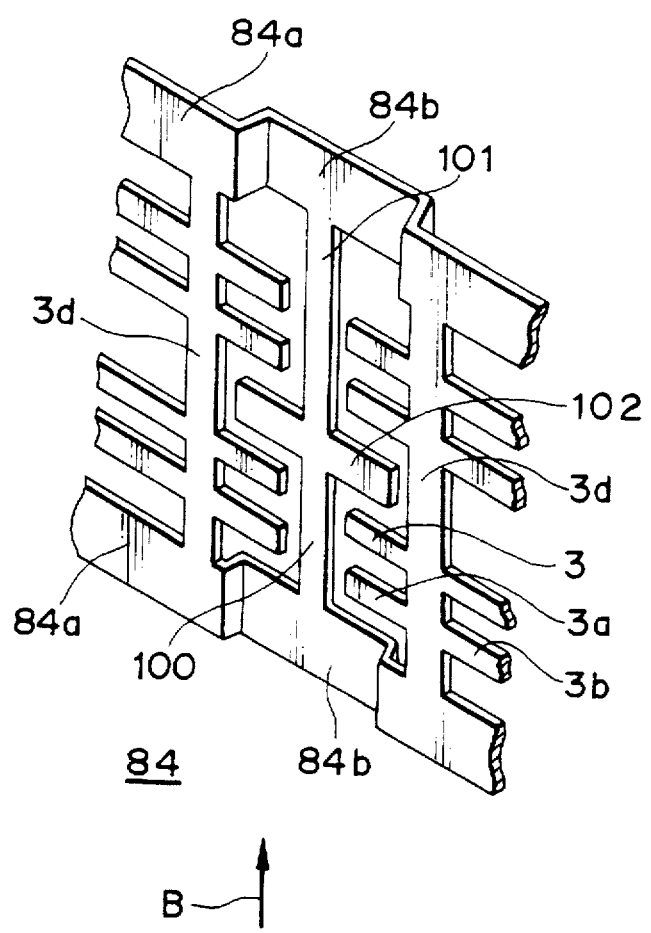
FIG. 19 is a plan view showing one embodiment of a leadframe relating to sixth and seventh aspects of the present invention.

In accordance with the sixth and seventh aspects of the present invention, FIG. 19 shows a leadframe which is modified from the leadframe shown in FIG. 13 or 17 so that a semiconductor chip can be inserted from a side position of a leadframe-transfer path. The sixth aspect of the invention relates to a leadframe and the seventh to a method for producing a semiconductor device using a leadframe of the sixth aspect of the invention. In previous embodiments, a die pad 100 is sunk from an outer frame 83a by bending both end portions (suspending leads) of the die pad 100, as shown in FIG. 14. In contrast, in a leadframe 84 shown in FIG. 19, both side portions of an outer frame 84a to which a die pad 100 is connected are bent into U-shape (U-shaped portions 84b) so that the die pad 100 is sunk from the outer frame 83a. Such a leadframe having a die pad 100 sunk by bending portions of the outer frame 84a into U-shape has following advantages: (1) The die pad 100 can be sunk more deeply; (2) This technology can be adapted even to a thin leadframe having small mechanical strength; and (3) Leads 3 extending from both sides can be located close to the leads on the opposite side. These advantages can be obtained independently of the relation in directions between the die pad and the frame-transfer paths. Thus, a leadframe in accordance with the sixth aspect of the present invention has no limitations in on a direction in which a die pad extends, and it can be used in various fashions.

Figure 20:
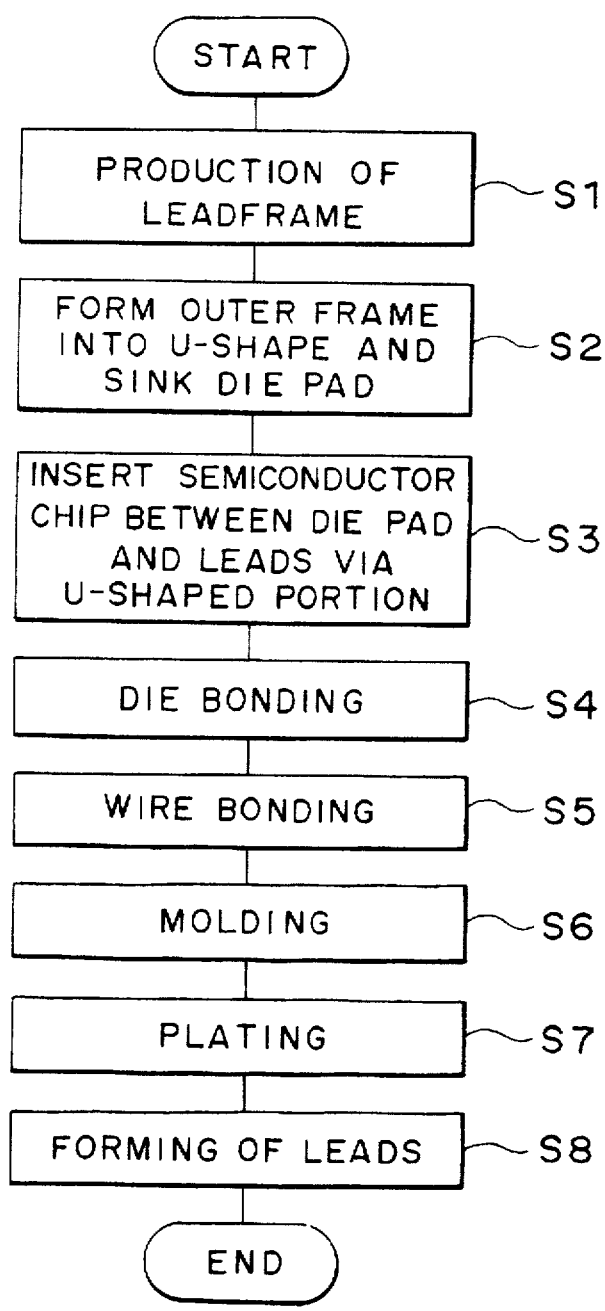
FIG. 20 is a flowchart showing a method for producing a semiconductor device in accordance with the seventh aspect of the present invention.
Figure 21:
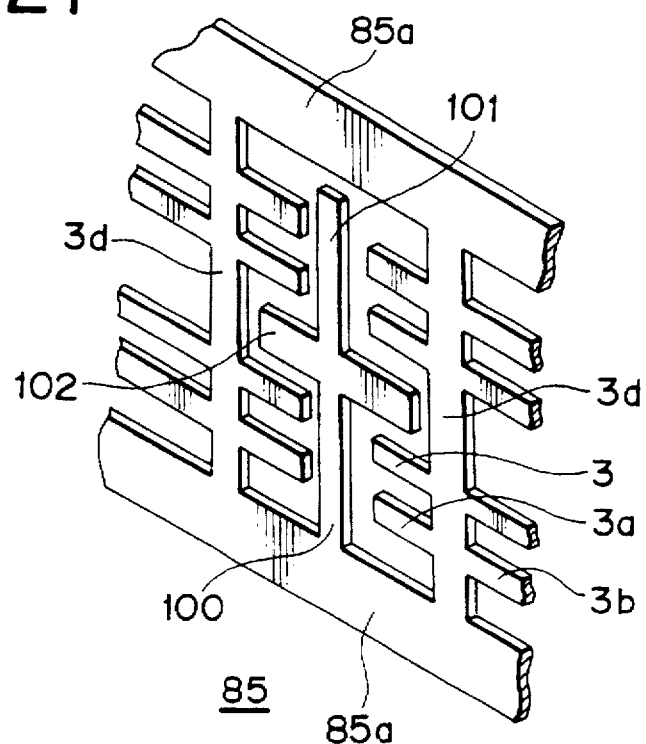
FIG. 21 is a perspective view showing one embodiment of a leadframe relating to eighth and ninth aspects of the present invention.

FIG. 20 is a flowchart showing a production method in accordance with the seventh aspect of the present invention.

Now, an example of a production method in accordance with the seventh aspect of the present invention will be described. First, by punching or etching a sheet of flat metal (not shown) in a similar way to those in the embodiments described above, a leadframe 84 is produced in a planar form which is the situation prior to that shown in FIG. 19 (leadframe production step S1). A die pad 100 is formed in such a way that its main pad 101 extends perpendicular to the direction in which the leadframe 84 is to be transferred during production steps of a semiconductor device (that is, perpendicular to the longitudinal direction of a leadframe, in this case). Then, the portions of both sides of outer frame 84a to which the die pad is connected (that is, the portions of outer frame located at both sides of leadframe-transfer path) are bent by means of pressing so as to form U-shaped portions 84b. These U-shaped portions are projected in the same direction, approximately perpendicular to the frame plane. In this way, the die pad 100 is sunk from the outer frame 84a and inner lead portions 3a (die-pad depression step S2). A semiconductor chip (not shown) is inserted in the direction denoted by an arrow B between the die pad 100 and the inner lead portions 3a via one of these U-shaped portions 84b (semiconductor chip insertion step S3). Therefore, the U-shaped portions 84b should have a large enough size for a semiconductor chip to be inserted via one of them. After this step, a semiconductor device is completed through the steps similar to those in the case of previous embodiments such as die bonding step S4, wire bonding step S5, molding step S6, exterior-plating step S7, and lead forming step S8.

In accordance with this aspect of the present invention, leadframes 84 are transferred in the longitudinal direction of the leadframes 84 during production processes and semiconductor chips are inserted transverse to the transfer path. Thus, the chip-insertion process can be performed easily. Furthermore, because both sides of the outer frame 84a are bent into the U-shape, it is possible to shorten the distance from the inner lead portions 3a extending from one side of the outer frame and those extending from the other side. As a result, the central lead portions 3a can extend to more inner locations of the semiconductor chip.

The Eighth and Ninth Aspects of the Invention

The present invention further includes another method for producing a semiconductor device using a unitary sheet frame comprising a die pad and leads.

Figure 32:
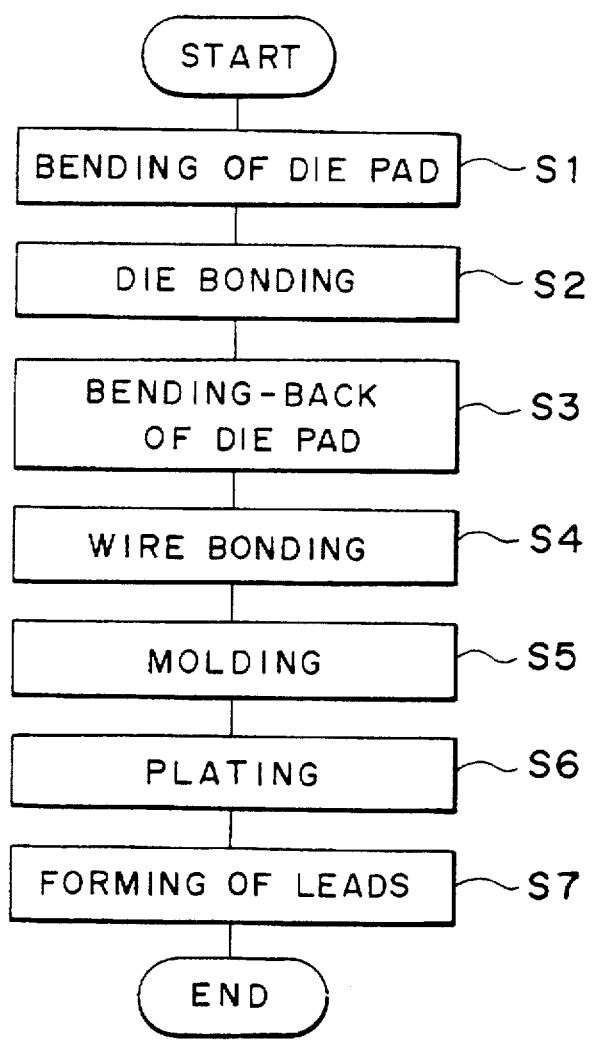
FIG. 32 is a flowchart showing one example of method for producing a semiconductor device in accordance with the ninth aspect of the present invention.

In accordance with eighth and ninth aspects of the present invention, a first embodiment is shown in FIGS. 21–24 relating to a leadframe and a method for producing a semiconductor device using this leadframe. In these figures, there are shown a leadframe 85 having an outer frame 85a, a die pad 100, and a plurality of leads 3. The die pad 100 comprises a main pad 101 and branch pads 102. Each lead 3 comprises an inner lead portion 3a and an outer lead portion 3b. There are also provided tie-bars 3d for connecting leads to each other. This leadframe is the same as that shown in FIG. 13 in accordance with the fourth aspect of the present invention except that only one end portion of the die pad 100 is connected to the outer frame 85a. FIG. 32 is a flowchart showing a production method in accordance with the ninth aspect of the invention.

Figure 22:
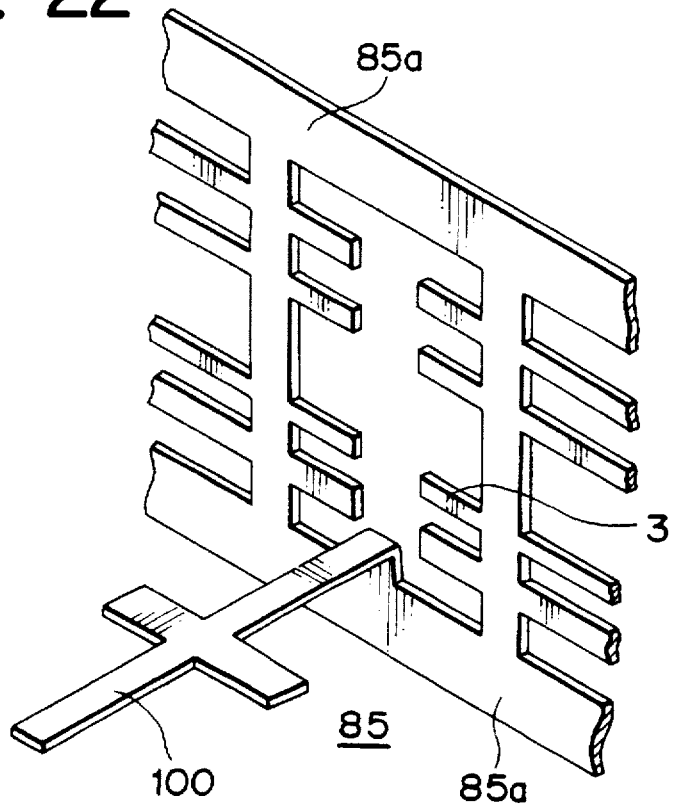
FIG. 22 is a perspective view showing a die-pad bending step in a method for producing a semiconductor device in accordance with the ninth aspect of the present invention.
Figure 23:
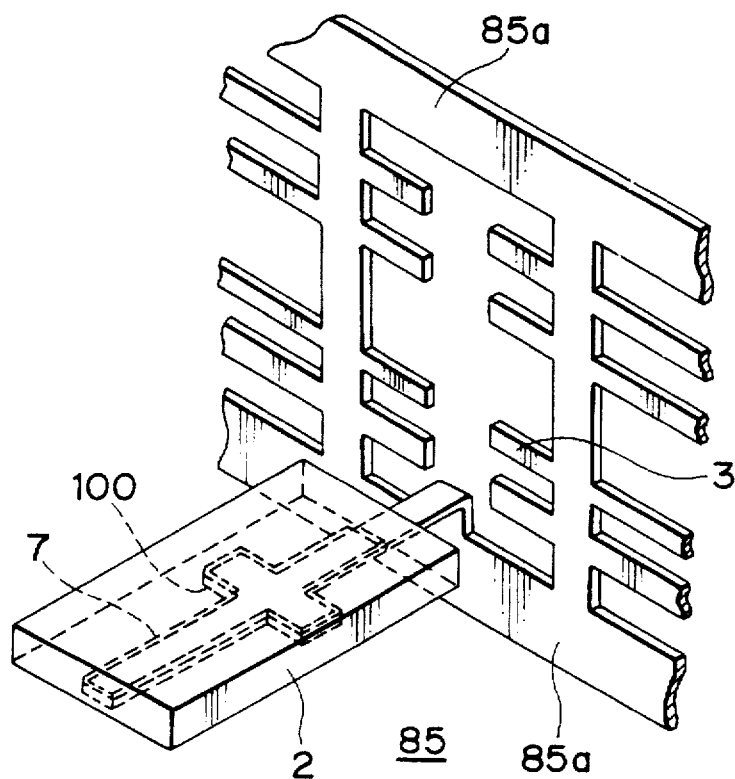
FIG. 23 is a perspective view showing a die-bonding step in a method for producing a semiconductor device in accordance with the ninth aspect of the present invention.

Referring to the figures, one embodiment of a production method in accordance with the ninth aspect of the invention will be described below. First, for example, one flat sheet of metal (not shown) is cut by punching or etching so as to produce a leadframe 85 as in FIG. 21. Here, one end of a die pad 100 is connected to an outer frame 85a, and a plurality of leads 3 extend from both sides of the outer frame 85a toward the die pad 100. Then, the die pad 100 is bent outward from the outer frame 85a as shown in FIG. 22 (die pad bending step S1). In this step, the die pad 100 is bent such that the die pad 100 is approximately perpendicular (at 90 degrees) to the outer frame 85a. Then, as shown in FIG. 23, a semiconductor chip 2 is attached onto the bent die pad 100 with hard solder 7 such as common solder (die bonding step S2). In this way, a semiconductor chip can be easily die-bonded onto a die pad 100.

Figure 24:
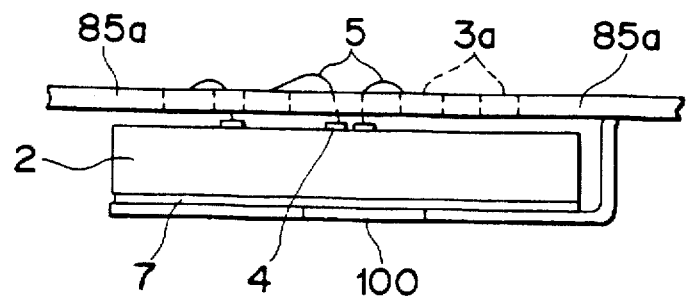
FIG. 24 is a side view showing a die-pad bending-back step and a wire-bonding step in a method for producing a semiconductor device in accordance with the ninth aspect of the present invention.
Figure 25:
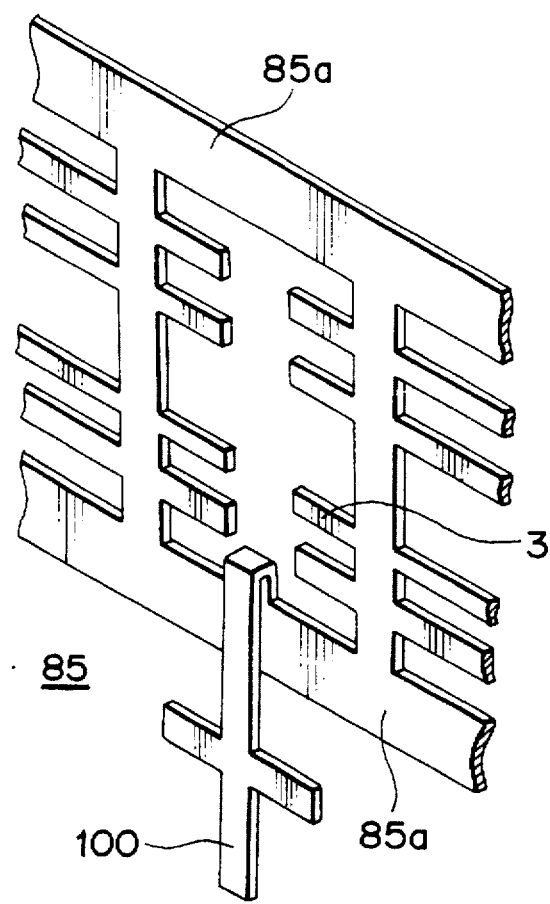
FIG. 25 is a perspective view showing another example of a die-pad bending step in a method for producing a semiconductor device in accordance with the ninth aspect of the present invention.

Now, as shown in FIG. 24, the die pad 100, having the semiconductor chip 2 mounted on it, is bent back toward the outer frame 85a (die-pad bending-back step S3). As shown, the die pad 100 is bent in the form of L-shape so that the inner lead portion 3a of each lead 3 extends over a primary surface of the semiconductor chip 2 having electrodes 4 and a circuit (not shown) on the primary surface of the semiconductor chip 2 in such a way that a predetermined constant spacing is maintained between the primary surface and the inner lead portions 3a. Then, the respective electrodes 4 on the semiconductor chip 4 are connected to corresponding inner lead portions 3a of leads 3 with thin metal wires 5 by means of ultrasonic-thermocompression wire bonding, thus electrical connections are achieved (wire bonding step S4). After this step, a semiconductor device is completed through the steps similar to those in the case of previous embodiments such as molding step S5, exterior-plating step S6, and lead forming step S7. In the above specific embodiment, a semiconductor chip 2 is die-bonded to the die pad 100 after the die pad 100 is bent by 90 degrees with respect to the outer frame 85a. However the bending angle of the die pad 100 is not so limited. The die pad 100 may be bent by 180 degrees as shown in FIG. 25, or by any arbitrary angle which results in easy die bonding.

The Tenth and Eleventh Aspects of the Invention

Figure 26:
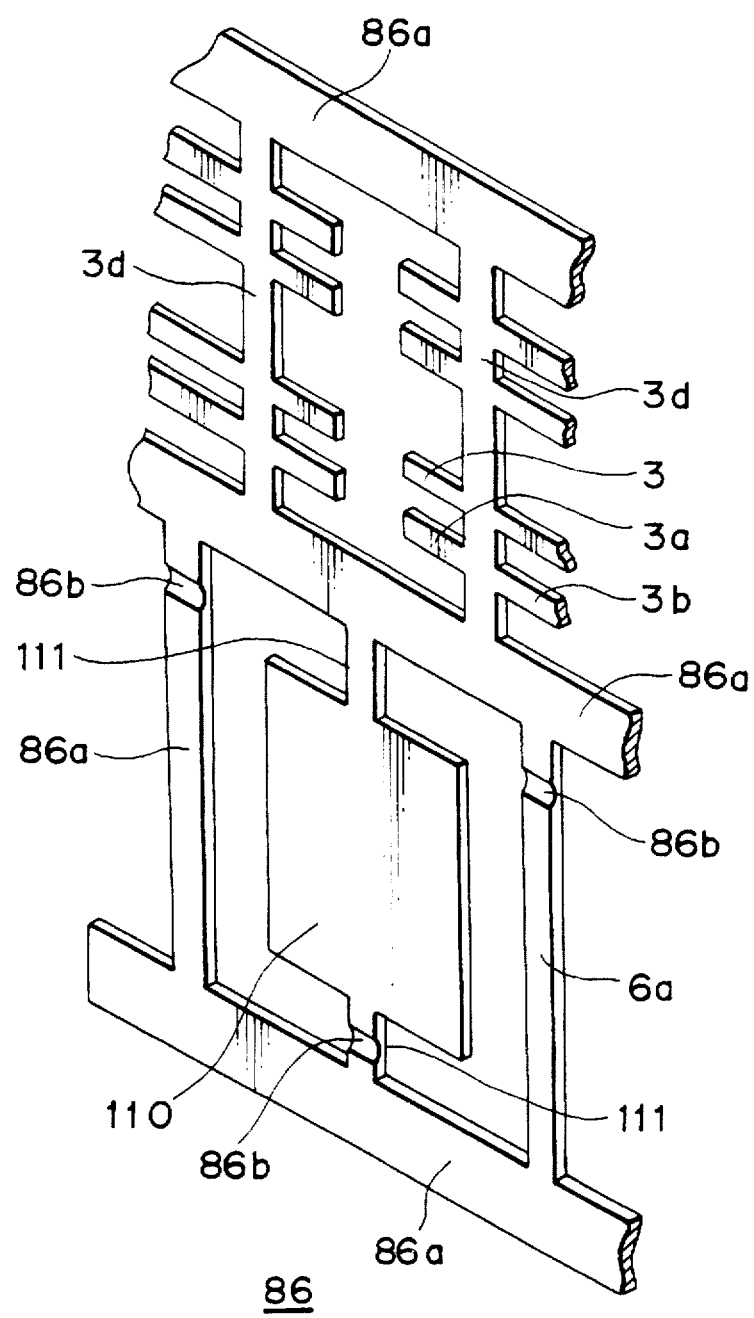
FIG. 26 is a perspective view showing one embodiment of a leadframe relating to tenth and eleventh aspects of the present invention.
Figure 27:
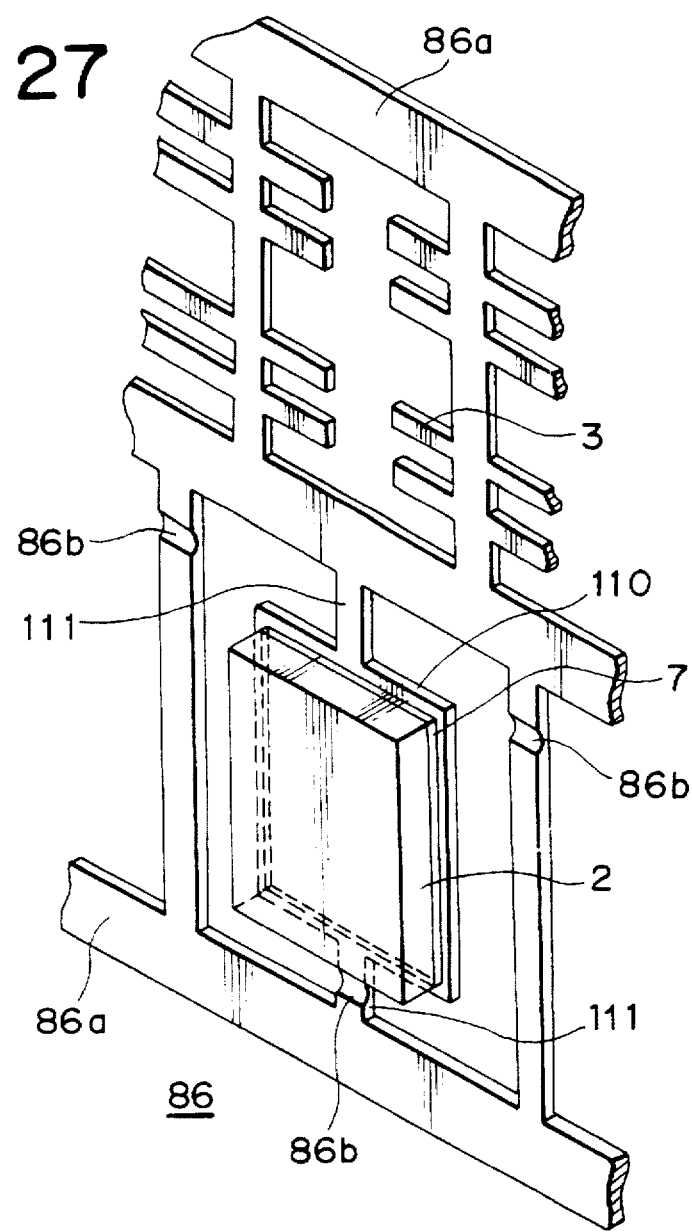
FIG. 27 is a perspective view showing a die-bonding step in a method for producing a semiconductor device in accordance with the eleventh aspect of the present invention.
Figure 28:
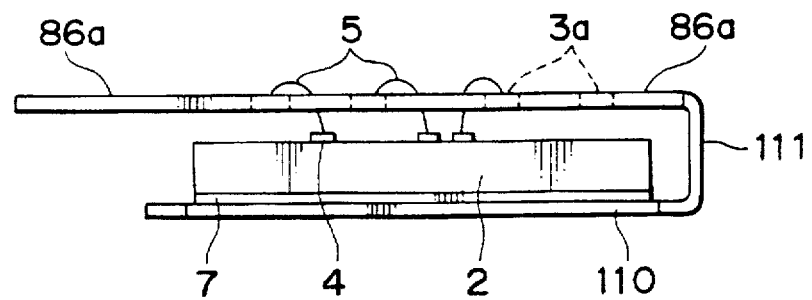
FIG. 28 is a side view showing a die-pad folding step and a wire-bonding step in a method for producing a semiconductor device in accordance with the eleventh aspect of the present invention.

In accordance with tenth and eleventh aspects of the present invention, a first embodiment is shown in FIGS. 26–28 relating to a leadframe and a method for producing a semiconductor device using this leadframe. In these figures, there is shown a wide leadframe 86 comprising an outer frame 86a, a die pad 110 in the sheet form, and leads 3. The outer frame 86a includes three strips. The die pad 110 has a size similar to that of a semiconductor chip 2 to be mounted on it. The ends of the die pad 110 are connected respectively to first and second strips of the outer frame 86a via suspending leads 111. The leads 3 are formed between the second and third strips. A production method in accordance with the eleventh aspect of the present invention is shown in a flowchart of FIG. 33.

Referring to the figures, a production method in accordance with the eleventh aspect of the present invention will be described below. First, as shown in FIG. 26, for example one flat sheet of metal (not shown) is cut by punching or etching so as to produce a wide leadframe 86 having a die pad and leads formed in a unitary fashion. In this leadframe 86, leads 3 are formed in a half-unit frame area and a die pad is formed in another neighboring half-unit frame area. Because the leadframe 86 is formed in such a way described above, the die pad 110 can be formed in the shape of a sheet which makes it possible to directly bond a chip onto the die pad without any further modification. As shown in FIG. 27, a semiconductor chip 2 is attached onto the die pad 110 with hard solder 7 such as common solder (die bonding step S1). Then, the outer frame 86a is cut at three half-etched portions 86b so as to remove an unnecessary portion (the lower portion including the first strip in FIG. 27) of the outer frame 86a around the die pad 110 (outer-frame cutting step S2). Furthermore, the die pad 110 with the mounted semiconductor chip 2 is bent at the suspending lead 111 into the U-shape so that the die pad 110 is folded toward the half-unit frame area of the outer frame 86a in which the leads 3 are formed, as shown in a cross sectional view of FIG. 28 (die-pad folding step S3). In this way, the inner lead portion 3a of each lead 3 is arranged with a predetermined constant spacing from a primary surface (upper surface) of the semiconductor chip 2 wherein electrodes 4 and a circuit (not shown) are formed on the primary surface. Then, a semiconductor device is completed through steps similar to those in the case of previous embodiments, such as a wire bonding step S4, molding step S5, exterior-plating step S6, and lead forming step S7. Japanese Patent Application Laid-Open No.63-34966 discloses a technology in which a leadframe is produced in the form of a sheet having a die pad and leads formed in an integrated fashion, and an area of the outer frame of the leadframe is folded so as to put leads opposite the die pad in a similar way to that of the present aspect of the invention. However, there is a significant difference that in the present aspect of the invention an unnecessary portion of an outer frame around a die pad is cut off, and then a suspending lead 111 for connecting the die pad to the outer-frame is bent into the U-shape so as to put the die pad opposite the leads. As can be seen, not only can the above process steps be easily performed, but also in succeeding steps, the leadframe can be easily handled. Moreover, because the unnecessary portion is removed, fewer transfer errors occur during the succeeding process steps.

The Twelfth and Thirteenth Aspects of the Invention

Figure 29:
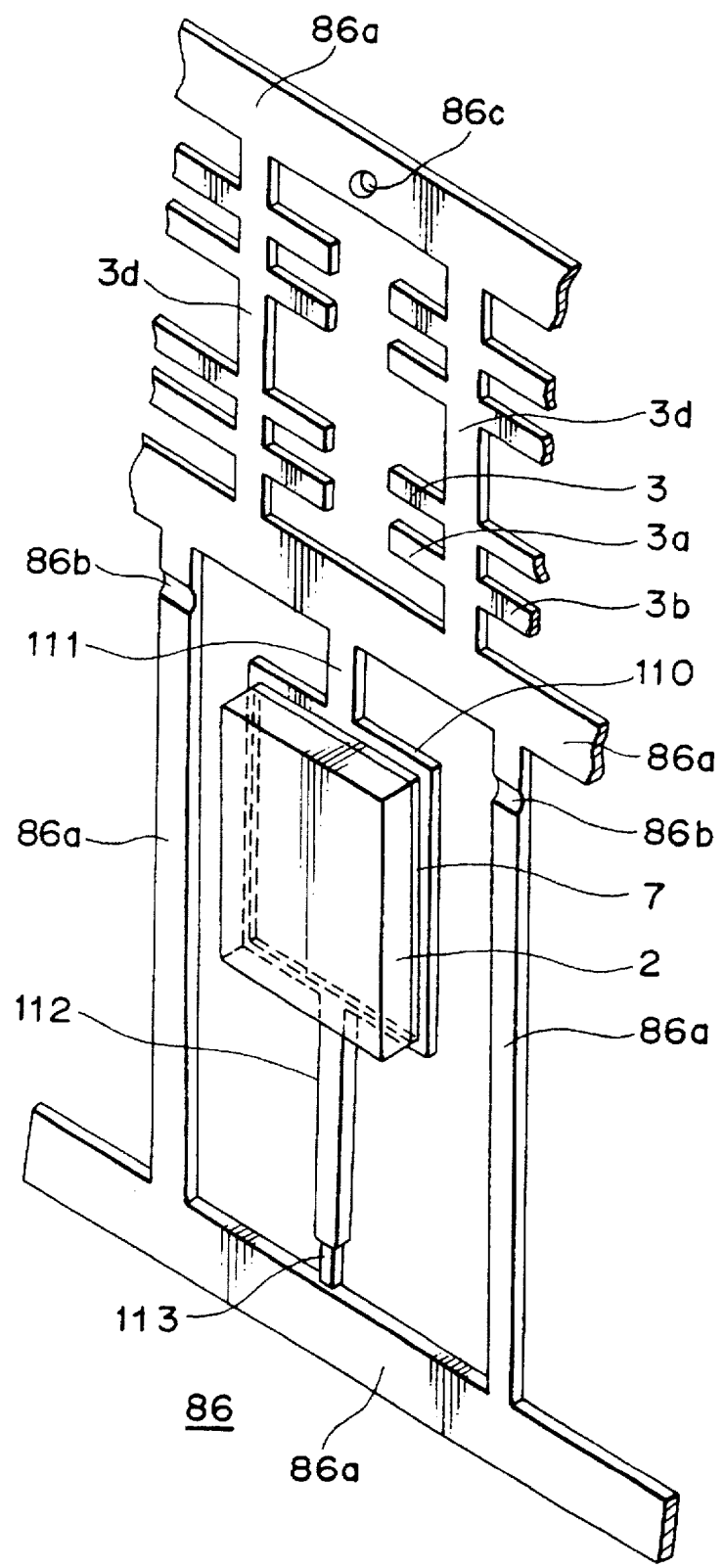
FIG. 29 is a perspective view showing a die-bonding step in a method for producing a semiconductor device relating to twelfth and thirteenth aspects of the present invention.
Figure 30:
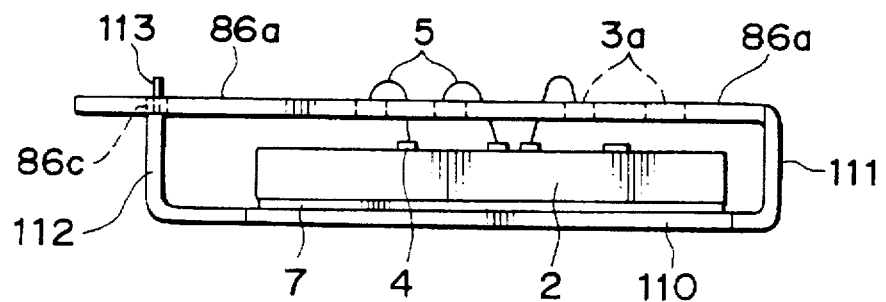
FIG. 30 is a side view showing a die-pad folding step, die-pad fixing step, and wire-bonding step in a method for producing a semiconductor device in accordance with the thirteenth aspect of the present invention.
Figure 33:
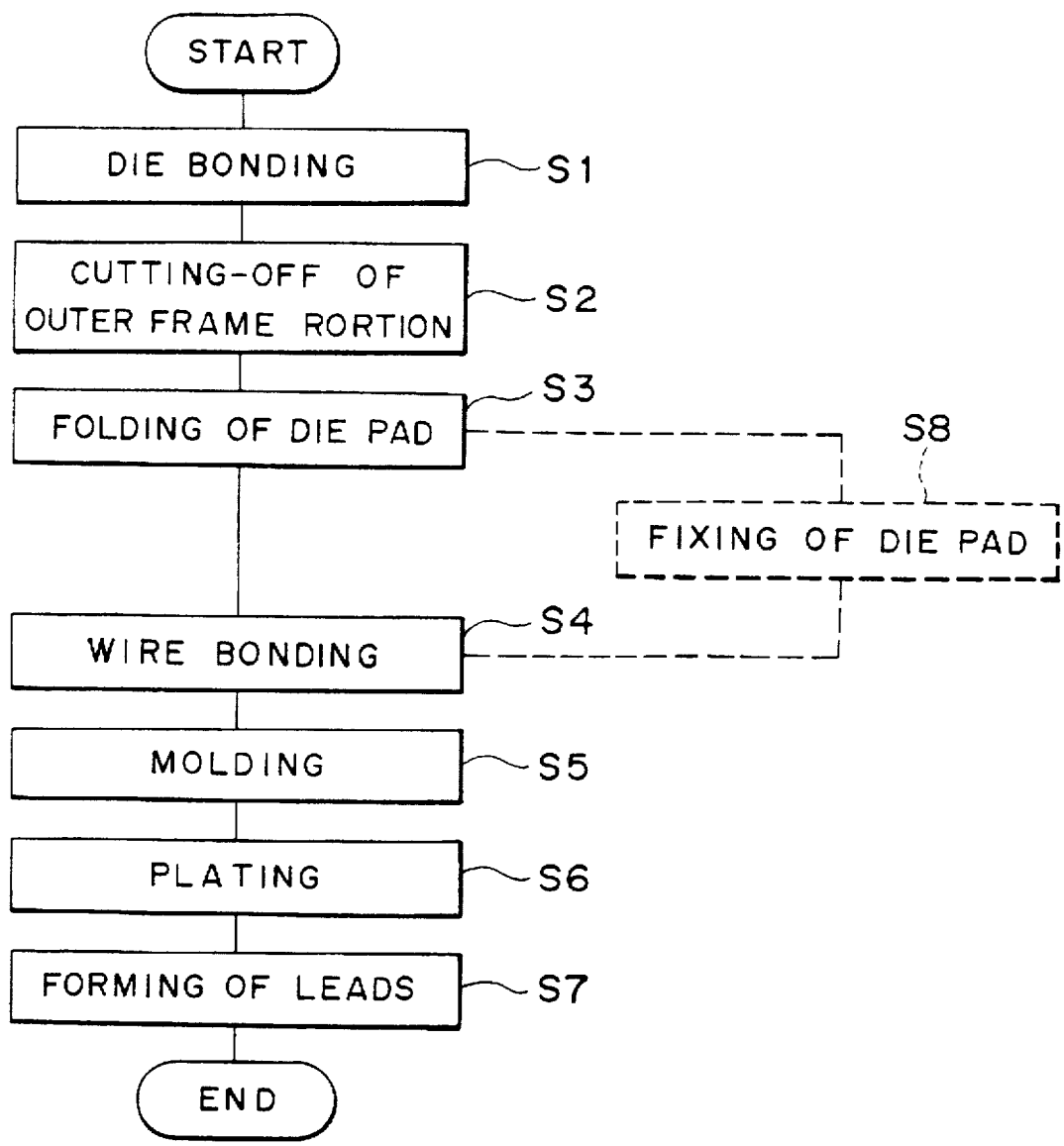
FIG. 33 a flowchart showing examples of method for producing a semiconductor device in accordance with the eleventh and thirteenth aspects of the present invention.

FIGS. 29 and 30 show a leadframe and a method for producing a semiconductor device using this leadframe in accordance with twelfth and thirteenth aspects of the present invention. The differences from the leadframe described above in connection with FIG. 27 are that one of suspending leads on opposite sides of a die pad, that is, a suspending lead 112 extending in the direction opposite to leads 3, and being connected to a first strip is made longer there is also provided a thinner half-etched portion 113 at the end of the suspending lead 112, and a fixing means, that is, a positioning hole 86c in a strip located opposite the die pad 110 in an area of frame 86a in which the leads 3 are formed. The process steps of this embodiment can be described by a flowchart added with a step denoted by dotted lines in FIG. 33, wherein FIG. 33 is a flowchart showing the eleventh aspect of the present invention.

In this embodiment, in a process step for cutting off an unnecessary portion of the outer frame 86a around the die pad 110 as well as the half-etched portions 86b of the outer frame 86a, the half-etched portion 113 is cut so that the longer suspending lead 112 remains connected to the die pad 110. Then, by bending a suspending lead 111 into the U-shape as shown in FIG. 30, the die pad 110 with a mounted semiconductor chip 2 is folded toward the frame area 86a in which the leads 3 are formed (die-pad folding step S3). After that, the longer suspending lead 112 is bent into the L-shape and the thinned half-etched portion 113 is inserted into (or connected to) the positioning hole 86c in the strip of the outer frame 86a fix the die pad 110 to the leads 3 (die-pad fixing step S8). Thus, the present aspect of the invention provides a method adaptable to the mass production, which ensures that the distance between the surface of the semiconductor chip 2 and the inner lead portions 3a can be kept at a certain constant value, which further results in better production yields. The other process steps are the same as those in the case of the eleventh aspect of the present invention.

The Fourteenth Aspect of the Invention

Figure 31:
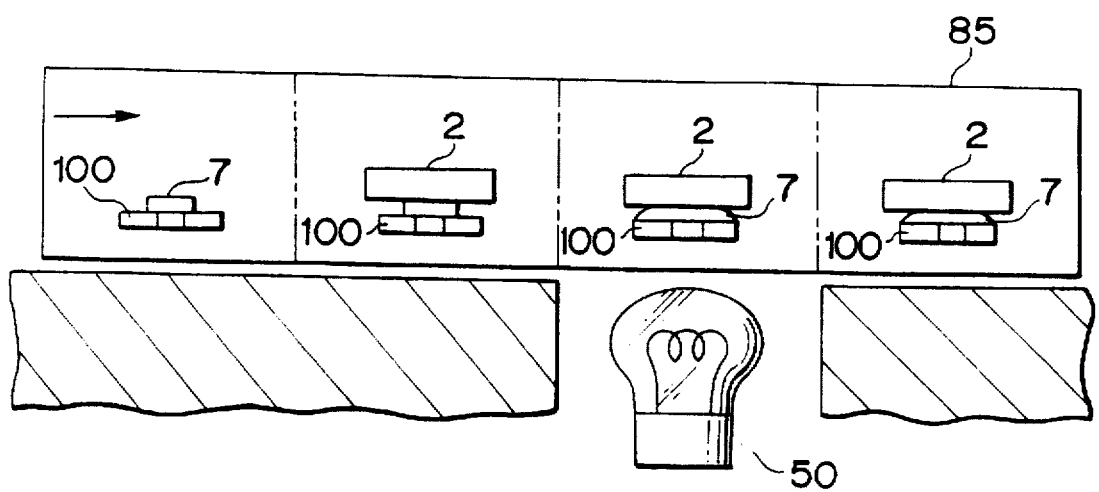
FIG. 31 is a schematic view showing one embodiment of a die-bonding step in a method for producing a semiconductor device in accordance with a fourteenth aspect of the present invention.
Figure 34:
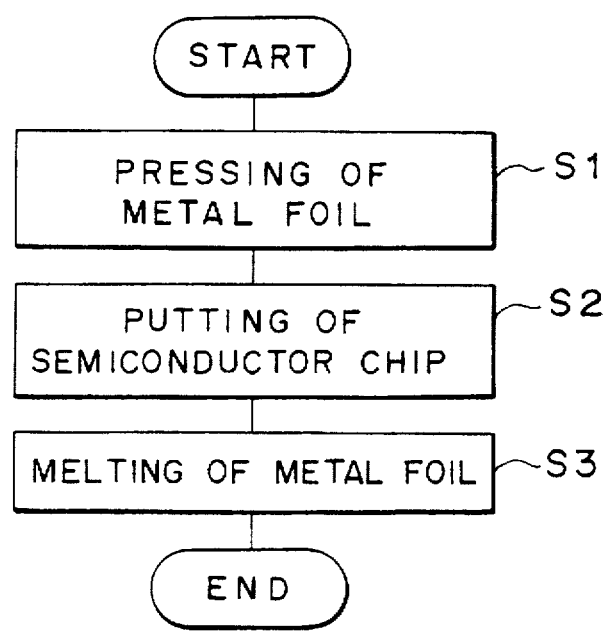
FIG. 34 is a flowchart showing one example of a die-bonding methods in accordance with the fourteenth aspect of the present invention.
Figure 35:
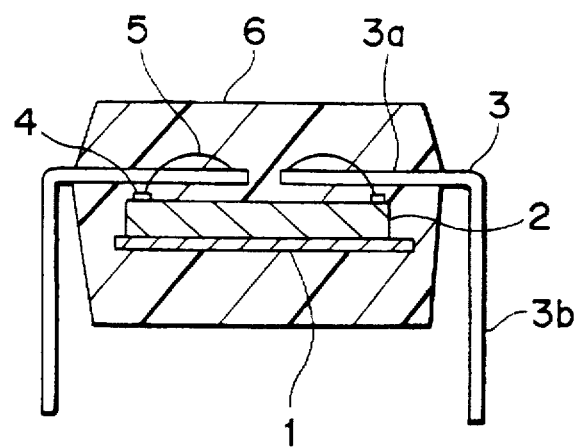
FIG. 35 is a cross sectional view of a conventional semiconductor device of a similar type.

In accordance with the fourteenth aspect of the present invention, there will be described a preferred embodiment of a die-bonding method which can be used in the die-bonding steps of the above-mentioned methods for producing the semiconductor devices. FIG. 31 shows an example of die-bonding methods used in production of semiconductor device, in accordance with the fourteenth aspect of the present invention. FIG. 34 is a flowchart showing this die-bonding method. In actual production, as described earlier, in order to produce a plurality of semiconductor devices at one time, a leadframe, for example the leadframe 85 shown in FIGS. 21 and 22, comprises a plurality of unit elements successively connected to neighboring unit elements, wherein each unit element comprises a die pad 100 and leads 3. The process steps described below are successively performed for one unit element at one time by shifting the leadframe 85 by one block (one pitch). In the first step, a metal foil comprising, for example, hard solder 7 such as conventional solder is placed on and pressed onto a die pad 100 (metal foil putting and pressing step S1). Then, the leadframe 85 is shifted by one pitch and a semiconductor chip 2 is put on the metal foil 7 on the die pad 100 (semiconductor chip putting step S2). After another one-pitch shifting, the die pad 100 is heated via its bottom portion by non-contacting heating means such as radiation from a heating lamp 50 so as to melt the metal foil 7 (metal foil melting step S3). By stopping heating (or by intentionally cooling), the melted metal foil 7 is solidified and the semiconductor chip 2 is connected to the die pad 100.

In actual production lines, in accordance with the die-bonding method described above, die bonding can be easily performed by shifting a leadframe by one pitch at a time. Especially in the case where a semiconductor chip is inserted between leads of a leadframe and a sunk die pad, this method makes the die-bonding process significantly easier. In the specific embodiment described above, the metal foil 7 is melted by heating it via the bottom of a die pad so that a circuit formed on the upper surface of a semiconductor chip is not be damaged. However, if the degree of heating is below a permissible level, the heating can be performed from the upper side or from both upper and lower sides.

As described above, the present invention provides a various advantages.

In a semiconductor device in accordance with the first aspect of the present invention, hard solder exhibiting no moisture absorption is used as a die-bonding material for die-bonding a semiconductor chip. As a result, moisture is not absorbed into the die-bonding material, and it is possible to avoid problems such as corrosion of the semiconductor chip, cracks in a package, and separation between the semiconductor chip and the die pad. Thus, a higher-reliability semiconductor device is obtained.

In a method in accordance with the second aspect of the present invention for producing a semiconductor device, after two leadframes, that is, one for leads and the other for a die pad, are connected to each other, an unnecessary portion of an outer frame of the leadframe for a die pad is cut off and removed from the other portions via frame-cutting slits formed in the frame for leads. Thus, during the succeeding processes after that, the leadframes can be treated as if the leadframe comprises only one frame. As a result, production processes can be simplified and can be performed easily. Therefore, the production efficiency and production yield can be improved. The third aspect of the present invention provides a leadframe having an advantage that after two leadframes, one for leads and the other for a die pad, are connected to each other, an unnecessary portion of one frame can be cut off and removed from the other portions.

In accordance with the fourth aspect of the present invention, a leadframe comprises a die pad including branch pads formed on both sides of the main die-pad portion, wherein each branch pad extends perpendicular to the main die-pad portion, and wherein each branch pad extends between leads. In this way, the width and the area of the die pad can be made substantially larger without modifying leads. The fifth aspect of the present invention provides a production method which makes possible to hold and fix a semiconductor chip on a die pad in a more stable manner, and further to improve thermal conduction efficiency between the die pad and the semiconductor chip. As a result, production processes especially a wire-bonding process can be performed easily, accurately, and efficiently. Thus, a high-reliability semiconductor device can be produced. Compared to a semiconductor device produced by using a conventional leadframe having a narrow die pad, the semiconductor device in accordance with the present aspect of the invention has a smaller area in direct contact with molding resin. As a result, there is less possibility of separation of the molding resin from the semiconductor chip. Thus, a higher-reliability semiconductor device can be obtained.

In a leadframe in accordance with the sixth aspect of the present invention, the portions on both sides of an outer frame to which a die pad is connected are bent into the U-shape so as to sink the die pad. Compared to the case where the die pad is sunk by bending the suspending leads on both sides of the die pad, this leadframe has advantages that the die pad can be sunk more deeply, and that larger mechanical strength can be obtained, and that it is possible to shorten the distance between leads extending from one side and those extending from the other side. The seventh aspect of the present invention provides a production method whereby a die pad extending perpendicular to the direction in which the leadframe is transferred during the processes of producing a semiconductor device is sunk by bending both side portions of the outer frame to which the die pad is connected into the U-shape, so that a semiconductor chip can be inserted from a location transverse to the leadframe-transfer path. Thus, the chip-insertion process can be performed easily. Furthermore, when the side portions are bent into the U-shape so as to form the U-shaped portions, the die pad is sunk from the leads, and, at the same time, the leads extending from one side become closer to the leads extending from the other side. As a result, it is possible to make the leads reach positions closer to the central part of the semiconductor chip, and it is possible to increase flexibility in electrode location.

In accordance with the eighth and ninth aspects of the present invention relating to a leadframe and a method for producing a semiconductor device using this leadframe wherein the leadframe includes a die pad and leads formed in an integral fashion, the die pad can be bent outward from the outer frame, and in this situation where the die pad is bent, a semiconductor chip can be die-bonded onto this die pad. This allows easier and more reliable processing, compared to the case where a semiconductor chip is inserted between a die pad and leads.

In accordance with the tenth and eleventh aspects of the present invention relating to a leadframe and a method for producing a semiconductor device using this leadframe wherein the unitary leadframe includes a die pad and leads, the die pad is formed within an outer frame area adjacent to another outer frame area in which leads are formed, both sides of the die pad being connected to the outer frame via suspending leads. A semiconductor chip is die-bonded onto the die pad, then an unnecessary portion of the outer frame around the die pad is cut off. After that, the suspending lead connected to the side of the die pad closer to the lead area is bent into the U-shape such that the die pad having the mounted semiconductor chip is folded over the leads. This process can be performed easily. Furthermore, because the unnecessary portion of the outer frame is removed, various advantages are obtained such that the succeeding process steps are made easier, and that transfer errors during the production processes can be decreased and production efficiency can be improved.

In accordance with the twelfth and thirteenth aspects of the present invention with regard to a leadframe and a method for producing a semiconductor device using this leadframe, more firm connection of the die pad to an outer frame area for leads is achieved by modifying the leadframe and the method in accordance with the tenth and eleventh aspects of the invention in such a way that a suspending lead portion remaining connected to the die pad is bent and connected to the outer frame area for leads. Thus, the succeeding processes can be performed more easily and more accurately.

In accordance with the fourteenth aspect of the present invention with regard to a die-bonding method, metal foil is placed on and pressed onto a die pad, then a semiconductor chip is put on this metal foil and the metal foil is melted by heating it. Then, the heating is stopped so as to solidify the metal foil and to attach the semiconductor chip on the die pad. This process step is carried out by shifting the leadframe by one pitch at a time. Thus, this method is suitable for use in a production line to die-bond a chip on a leadframe which is transferred on the production line. This method provides significant advantages in that die-bonding process becomes easier and more effective and production efficiency can be improved, in particular where die-bonding is performed after a semiconductor chip is inserted between the die pad and inner lead portions.

What is claimed is:

1. A leadframe for producing a semiconductor device having a lead-on-chip (LOC) structure wherein leads extend across a semiconductor chip comprising:

a frame for a die pad comprising an outer frame section, a die pad displaced from said outer frame section, and a suspending lead connecting said die pad to said outer frame section wherein said die pad is disposed inside said outer frame section; and a frame for leads comprising an outer frame portion and a plurality of leads extending from opposite sides of said outer frame portion and having at least one frame-cutting slit in said outer frame portion exposing said suspending lead for severing and removing an unnecessary portion of said frame for a die pad after said frame for leads is connected to said frame for a die pad, leaving said die pad connected to said frame for leads at said suspending lead, wherein one of said frame for a die pad and said frame for leads includes a projection and the other of said frame for a die pad and said frame for leads includes a hole, the hole receiving said projection, said projection being disposed parallel to said frame for leads, thereby connecting said frame for a die pad to said frame for leads.

2. A semiconductor device having a lead-on-chip (LOC) structure comprising:
- a semiconductor chip having first and second primary surfaces and a plurality of electrodes centrally disposed on said first primary surface;
- a frame for a die pad including a die pad and a suspending lead connected to said die pad, said semiconductor chip being bonded to said die pad at said second primary surface,
- a frame for leads comprising an outer frame portion and a plurality of leads extending from opposite sides of said outer frame portion, said frame for leads including at least one frame cutting slit in said outer frame portion providing access to said suspending lead for severing and removing an unnecessary portion of said frame for a die pad, said frame for a die pad and said frame for leads being connected at said outer frame portion so that said suspending lead is connected to said outer frame portion, said die pad is displaced from said outer frame portion, and inner lead portions of said leads extend across and are spaced from the first primary surface of said semiconductor chip, wherein one of said frame for a die pad and said frame for leads includes a projection and the other of said frame for a die pad and said frame for leads includes a hole receiving the projection wherein the projection is parallel to said outer frame portion;
- metal wires bonded to respective ones of said electrodes and corresponding ones of said inner lead portions; and
- a resin encapsulating said semiconductor chip, said die pad, and said wires, said outer frame portion and said inner lead portions.

* * * * *